(12) United States Patent
Spurlin et al.

(10) Patent No.: US 9,070,750 B2
(45) Date of Patent: Jun. 30, 2015

(54) METHODS FOR REDUCING METAL OXIDE SURFACES TO MODIFIED METAL SURFACES USING A GASEOUS REDUCING ENVIRONMENT

(71) Applicant: Novellus Systems, Inc., Fremont, CA (US)

(72) Inventors: Tighe A. Spurlin, Portland, OR (US); Darcy E. Lambert, Portland, OR (US); Durgalakshmi Singhal, Beaverton, OR (US); George Andrew Antonelli, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/787,499

(22) Filed: Mar. 6, 2013

(65) Prior Publication Data
US 2014/0256127 A1    Sep. 11, 2014

(51) Int. Cl.
*H01L 23/488* (2006.01)
*H01L 21/283* (2006.01)
*H01L 21/768* (2006.01)

(52) U.S. Cl.
CPC ................... *H01L 21/76873* (2013.01)

(58) Field of Classification Search
USPC ............ 438/622, 625, 627–629, 687
See application file for complete search history.

(56) References Cited

U.S. PATENT DOCUMENTS

| | | | |
|---|---|---|---|
| 4,642,161 A | 2/1987 | Akahoshi et al. | |
| 4,902,551 A | 2/1990 | Nakaso et al. | |
| 5,252,196 A | 10/1993 | Sonnenberg et al. | |
| 6,197,181 B1 | 3/2001 | Chen | |
| 6,204,192 B1 | 3/2001 | Zhao et al. | |
| 6,232,230 B1 * | 5/2001 | Iacoponi | 438/687 |
| 6,319,384 B1 | 11/2001 | Taylor et al. | |
| 6,432,821 B1 | 8/2002 | Dubin et al. | |
| 6,440,291 B1 | 8/2002 | Henri et al. | |
| 6,610,192 B1 | 8/2003 | Step et al. | |
| 6,638,411 B1 | 10/2003 | Mishima et al. | |
| 6,664,122 B1 | 12/2003 | Andryuschenko et al. | |
| 6,699,380 B1 | 3/2004 | Chen et al. | |

(Continued)

OTHER PUBLICATIONS

U.S. Application titled, "Method for Improving the Nucleation and Morphology of Ruthenium Liners Deposited on Tantalum Nitride," Gopinath, et al., filed Sep. 29, 2006, U.S. Appl. No. 11/540,937.

(Continued)

*Primary Examiner* — Thanhha Pham
(74) *Attorney, Agent, or Firm* — Weaver Austin Villeneuve & Sampson LLP

(57) ABSTRACT

Method and apparatus for reducing metal oxide surfaces to modified metal surfaces are disclosed. Metal oxide surfaces are reduced to form a film integrated with a metal seed layer on a substrate by exposing the metal oxide surfaces to a reducing gas atmosphere comprising radicals of a reducing gas species. The radicals of the reducing gas species can form from exposing the reducing gas species to ultraviolet radiation and/or a plasma. The substrate is maintained at a temperature below a temperature that produces agglomeration of the metal seed layer during exposure to the reducing gas atmosphere, such as below 150° C. for copper. In some embodiments, the reducing gas species can include at least one of hydrogen, ammonia, carbon monoxide, diborane, sulfite compounds, carbon and/or hydrocarbons, phosphites, and hydrazine.

20 Claims, 12 Drawing Sheets

(56) References Cited

U.S. PATENT DOCUMENTS

| | | | |
|---|---|---|---|
| 6,720,204 B2 | 4/2004 | Sudijono et al. | |
| 6,764,952 B1 | 7/2004 | Yu et al. | |
| 6,793,796 B2 | 9/2004 | Reid et al. | |
| 6,815,349 B1 | 11/2004 | Minshall et al. | |
| 6,844,258 B1 | 1/2005 | Fair et al. | |
| 6,849,122 B1 | 2/2005 | Fair | |
| 6,902,605 B2 | 6/2005 | Kolics et al. | |
| 6,946,401 B2 | 9/2005 | Huang et al. | |
| 6,962,873 B1 | 11/2005 | Park | |
| 7,232,513 B1 | 6/2007 | Webb et al. | |
| 7,265,061 B1 | 9/2007 | Cho et al. | |
| 7,327,948 B1 | 2/2008 | Shrinivasan et al. | |
| 7,405,157 B1 | 7/2008 | Reid et al. | |
| 7,442,267 B1 | 10/2008 | Webb et al. | |
| 7,456,102 B1 | 11/2008 | Varadarajan et al. | |
| 7,799,684 B1 | 9/2010 | Reid et al. | |
| 7,851,232 B2 | 12/2010 | Van Schravendijk et al. | |
| 7,874,218 B2 | 1/2011 | Izumi et al. | |
| 7,879,218 B1 | 2/2011 | Webb et al. | |
| 7,897,198 B1 | 3/2011 | Park et al. | |
| 7,941,039 B1 | 5/2011 | Shrinivasan et al. | |
| 7,964,506 B1 | 6/2011 | Ponnuswamy et al. | |
| 8,033,771 B1 | 10/2011 | Gage et al. | |
| 8,043,958 B1 | 10/2011 | Reid et al. | |
| 8,084,339 B2 | 12/2011 | Antonelli et al. | |
| 8,137,465 B1 | 3/2012 | Shrinivasan et al. | |
| 8,137,467 B2 | 3/2012 | Meinhold et al. | |
| 8,197,662 B1 | 6/2012 | Webb et al. | |
| 8,217,513 B2 | 7/2012 | Antonelli et al. | |
| 8,242,028 B1 | 8/2012 | Van Schravendijk et al. | |
| 8,288,288 B1 | 10/2012 | Gage et al. | |
| 8,371,567 B2 | 2/2013 | Angelov et al. | |
| 2001/0013473 A1 | 8/2001 | Taylor | |
| 2001/0015321 A1 | 8/2001 | Reid et al. | |
| 2002/0195352 A1 | 12/2002 | Mayer et al. | |
| 2003/0001271 A1 | 1/2003 | Uozumi | |
| 2003/0036280 A1 | 2/2003 | Jain et al. | |
| 2004/0000488 A1 | 1/2004 | Yang | |
| 2004/0084301 A1 | 5/2004 | Dordi et al. | |
| 2004/0118697 A1* | 6/2004 | Wen+ et al. | 205/215 |
| 2004/0142557 A1 | 7/2004 | Levy et al. | |
| 2004/0226827 A1 | 11/2004 | Matsuda et al. | |
| 2005/0208754 A1* | 9/2005 | Kostamo et al. | 438/622 |
| 2009/0095220 A1 | 4/2009 | Meinhold et al. | |
| 2009/0277867 A1 | 11/2009 | Mayer et al. | |
| 2010/0200412 A1 | 8/2010 | Reid et al. | |
| 2011/0146571 A1 | 6/2011 | Bartlett et al. | |
| 2014/0199497 A1 | 7/2014 | Spurlin et al. | |
| 2014/0256128 A1 | 9/2014 | Spurlin et al. | |

OTHER PUBLICATIONS

U.S. Application titled, "Copper Electroplating Process for Uniform Across Wafer Deposition and Void Free Filling on Semi-Noble Metal Coated Wafers," Ponnuswamy et al., filed Sep. 29, 2006, U.S. Appl. No. 12/785,205.

U.S. Application titled, "Copper Electroplating Process for Uniform Across Wafer Deposition and Void Free Filling on Semi-Noble Metal Coated Wafers," Ponnuswamy et al., filed Feb. 7, 2012, U.S. Appl. No. 13/367,710.

U.S. Application titled, "Deposit Morphology of Electroplated Copper After Selective Removal of Copper Oxides During Pretreatment," Webb et al., filed Jul. 11, 2012, U.S. Appl. No. 13/546,146.

U.S. Application titled, "Wetting Pretreatment for Enhanced Damascene Metal Filling," Mayer et al., filed Jan. 8, 2010, U.S. Appl. No. 12/684,787.

U.S. Application titled, "Methods for Reducing Metal Oxide Surfaces to Modified Metal Surfaces," Spurlin et al., filed Jan. 14, 2013, U.S. Appl. No. 13/741,151.

U.S. Application titled, "Single-Chamber Sequential Curing of Semiconductor Wafers," Shrinivasan et al., filed Feb. 10, 2012, U.S. Appl. No. 13/370,579.

U.S. Application titled, "Cast Pedestal With Heating Element and Coaxial Heat Exchanger," Shrinivasan et al., filed May 21, 2007, U.S. Appl. No. 11/751,584.

U.S. Application titled, "Tailored Profile Pedestal for Thermo-Elastically Stable Cooling or Heating of Substrates," Landess et al., filed May 12, 2005, U.S. Appl. No. 11/129,266.

U.S. Application titled, "Tailored Profile Pedestal for Thermo-Elastically Stable Cooling or Heating of Substrates," Landess et al., filed Mar. 29, 2010, U.S. Appl. No. 12/749,170.

U.S. Application titled, "Concave Pedestal for Uniform Heating of Silicon Wafers," Doble et al., filed Oct. 10, 2006, U.S. Appl. No. 11/546,189.

U.S. Application titled, "Pedestal Covers," Angelov et al., filed Apr. 13, 2011, U.S. Appl. No. 13/086,010.

U.S. Application titled, "Pedestal Covers," Angelov et al., filed Jan. 8, 2013, U.S. Appl. No. 13/736,410.

U.S. Application titled, "Minimum Contact Area Wafer Clamping With Gas Flow for Rapid Wafer Cooling," Gage et al., filed Sep. 7, 2011, U.S. Appl. No. 13/227,160.

U.S. Application titled, "Transferring Heat in Loadlocks," Gage et al., filed Sep. 15, 2012, U.S. Appl. No. 13/621,060.

U.S. Application titled, "Method and Apparatus for UV Exposure of Low Dielectric Constant Materials for Porogen Removal and Improved Mechanical Properties," Cho et al., filed Jan. 22, 2007, U.S. Appl. No. 11/656,661.

U.S. Application titled, "Tensile Dielectric Films Using UV Curing," Varadarajan et al., filed Oct. 22, 2004, U.S. Appl. No. 10/972,084.

U.S. Application titled, "UV Treatment for Carbon-Containing Low-K Dielectric Repair in Semiconductor Processing," Van Schravendijk et al., filed Nov. 5, 2010, U.S. Appl. No. 12/940,324.

U.S. Application titled, "Carbon Containing Low-K Dielectric Constant Recovery Using UV Treatment," Varadarajan et al., filed Dec. 20, 2010, U.S. Appl. No. 12/973,549.

U.S. Application titled, "Recovering Optical Properties of UV-Degraded Silica Element," Chen et al., filed Aug. 13, 2012, U.S. Appl. No. 61/682,556.

U.S. Application titled, "Remote Plasma Processing of Interface Surfaces," Antonelli et al., filed Jul. 31, 2009, U.S. Appl. No. 12/533,960.

U.S. Application titled, "Remote Plasma Based Deposition of SiOC Class of Films," Varadarajan et al., filed Jun. 12, 2012, U.S. Appl. No. 13/494,836.

U.S. Patent Application titled, "Method and Apparatus for Remote Plasma Treatment for Reducing Metal Oxides on a Metal Seed Layer," filed Sep. 6, 2013, U.S. Appl. No. 14/020,339.

U.S. Patent Application titled, "Pretreatment Method for Photoresist Wafer Processing," filed Apr. 21, 2014, U.S. Appl. No. 14/257,744.

U.S. Patent Application titled, "Method and Apparatus for Preparing a Substrate with a Semi-Noble Metal Layer," filed Apr. 18, 2014, U.S. Appl. No. 14/256,671.

U.S. Patent Application titled, Atmospheric Plasma Apparatus for Semiconductor Processing, filed Jun. 30, 2014, U.S. Appl. No. 14/320,171.

U.S. Patent Application titled, "Improved Deposit Morphology of Electroplated Copper," filed Jun. 11, 2012, U.S. Appl. No. 13/493,933.

U.S. Application titled, "Apparatus for Advanced Packaging Applications," Buckalew et al., filed May 29, 2013, U.S. Appl. No. 13/904,283.

US Office Action, dated Oct. 18, 2005, issued in U.S. Appl. No. 10/741,048.

US Office Action, dated Mar. 9, 2006, U.S. Appl. No. 10/741,048.

US Office Action, dated Mar. 17, 2006, issued in U.S. Appl. No. 10/741,048.

US Final Office Action, dated Jul. 18, 2006, issued in U.S. Appl. No. 10/741,048.

US Office Action, dated Nov. 27, 2006, issued in U.S. Appl. No. 10/741,048.

US Final Office Action, dated Apr. 24, 2007, issued in U.S. Appl. No. 10/741,048.

(56) References Cited

OTHER PUBLICATIONS

US Office Action, dated Aug. 9, 2007, issued in U.S. Appl. No. 10/741,048.

US Final Office Action, dated Dec. 14, 2007, issued in U.S. Appl. No. 10/741,048.

US Examiner's Answer Before the Board of Patent Appeals and Interferences, dated Jun. 18, 2008, issued in U.S. Appl. No. 10/741,048.

US Examiner's Decision on Appeal Before the Board of Patent Appeals and Interferences, dated Sep. 17, 2010, issued in U.S. Appl. No. 10/741,048.

US Notice of Allowance, dated Sep. 23, 2010, issued in U.S. Appl. No. 10/741,048.

US Notice of Allowance, dated Feb. 23, 2012, issued in U.S. Appl. No. 12/971,367.

US Office Action, dated May 1, 2013, issued in U.S. Appl. No. 13/493,933.

* cited by examiner

METHODS FOR REDUCING METAL OXIDE SURFACES TO MODIFIED METAL SURFACES USING A GASEOUS REDUCING ENVIRONMENT

INTRODUCTION

Field of the Invention

This disclosure generally relates to reducing metal oxide surfaces on metal seed layers. Certain aspects of this disclosure pertain to reducing copper oxide surfaces to a film integrated with a copper seed layer in damascene copper structures.

BACKGROUND

Formation of metal wiring interconnects in integrated circuits (ICs) can be achieved using a damascene or dual damascene process. Typically, trenches or holes are etched into dielectric material, such as silicon dioxide, located on a substrate. The holes or trenches may be lined with one or more adhesion and/or diffusion barrier layers. Then a thin layer of metal may be deposited in the holes or trenches that can act as a seed layer for electroplated metal. Thereafter, the holes or trenches may be filled with electroplated metal.

Typically, the seed metal is copper. However, other metals such as ruthenium, palladium, iridium, rhodium, osmium, cobalt, nickel, gold, silver, and aluminum, or alloys of these metals, may also be used.

To achieve higher performance ICs, many of the features of the ICs are being fabricated with smaller feature sizes and higher densities of components. In some damascene processing, for example, copper seed layers on 2x-nm node features may be as thin as or thinner than 50 Å. Technical challenges arise with smaller feature sizes in producing metal seed layers and metal interconnects substantially free of voids or defects.

SUMMARY

This disclosure pertains to methods of reducing metal oxides on a metal seed layer to a pure metal to form an integrated film with metal seed layer. The method can involve exposure of the metal oxide to a reducing gas atmosphere, where the reducing gas atmosphere contains radicals of a reducing gas species. The metal seed layer can be disposed on a substrate that is maintained at a temperature below the temperature that produces agglomeration in the metal seed layer. In some aspects, the reducing gas species can be exposed to a ultraviolet (UV) radiation source or a remote plasma source to form the radicals. In some aspects, the metal includes copper. Additional steps for the method include transferring the substrate to a plating bath containing a plating solution and plating metal onto the metal seed layer using the plating solution.

This disclosure also pertains to apparatus such as systems and platforms containing plating modules, reducing modules, and optionally other modules associated with pretreatment. The apparatus is configured to reduce metal oxides on a metal seed layer to form an integrated film with the metal seed layer. In some embodiments, the apparatus includes a controller with instructions configured to perform operations for reducing metal oxides on a metal seed layer to form an integrated film with the metal seed layer by exposing the metal oxides to a reducing gas atmosphere, where the reducing gas atmosphere comprises radicals of a reducing gas species. The substrate can be maintained at a temperature below the temperature that produces agglomeration of the metal in the metal seed layer.

In some embodiments, the substrate may be maintained at a temperature below about 150° C. Maintaining a relatively low temperature can be accomplished using an active cooling system. An active cooling system can include a water-cooled pedestal coupled with heat transfer via uniform gas flow across the substrate. In some embodiments, the substrate can be used in damascene copper structures. The thickness of the metal seed layer can be less than about 100 Å and the height to width aspect ratios of recesses on the plating surface can be greater than about 5:1. In some embodiments, the reducing gas species includes at least one of hydrogen, ammonia, carbon and/or hydrocarbons, diborane, carbon monoxide, sulfite compounds, phosphites, and hydrazine. If the reducing gas species is exposed to UV radiation, the wavelength of the radiation can be between about 100 nm and about 400 nm. Whether the reducing gas species is exposed to a remote plasma or UV radiation, various parameters may be optimized within a process window, including power, chamber pressure, chamber temperature, flow rate, duration of exposure, etc. In some embodiments, the exposing step may be maintained under an atmosphere substantially free of oxygen while transferring the substrate to the plating bath.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Although the present invention may be used in a variety of applications, one very useful application is the damascene or dual damascene process commonly used in the manufacture of semiconductor devices. The damascene or dual damascene processes may include metal interconnects, such as copper interconnects.

A generalized version of a dual damascene technique may be described with reference to FIGS. 1A-1C, which depicts some of the stages of the dual damascene process.

Figure 1A:
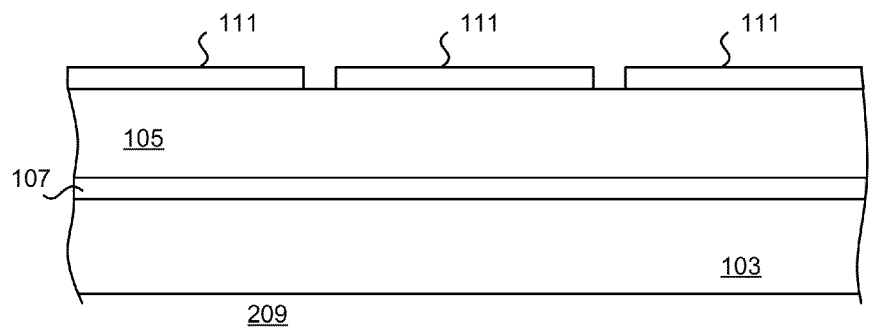
FIG. 1A shows an example of a cross-sectional schematic of dielectric layers prior to a via etch in a damascene process.
Figure 1B:
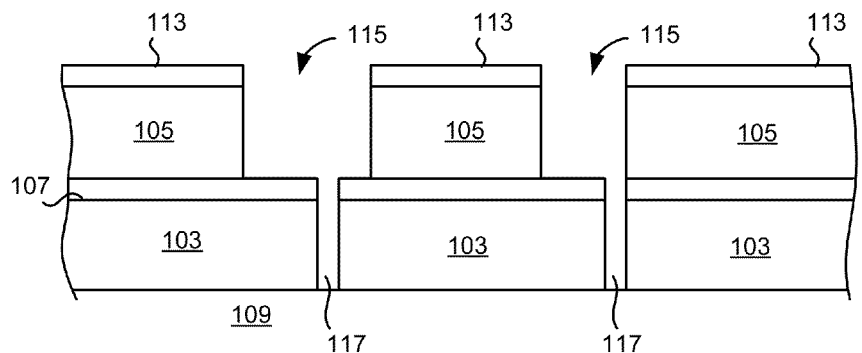
FIG. 1B shows an example of a cross-sectional schematic of the dielectric layers in FIG. 1A after an etch has been performed in the damascene process.
Figure 1C:
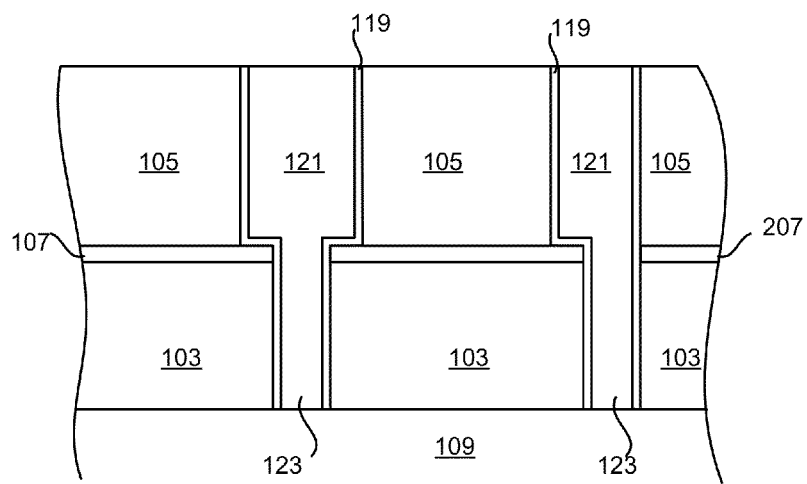
FIG. 1C shows an example of a cross-sectional schematic of the dielectric layers in FIGS. 1A and 1B after the etched regions have been filled with metal in the damascene process.

FIG. 1A shows an example of a cross-sectional schematic of one or more dielectric layers prior to a via etch in a damascene process. In a dual damascene process, first and second layers of dielectric are normally deposited in succession, possibly separated by deposition of an etch stop layer, such as a silicon nitride layer. These layers are depicted in FIG. 1A as a first dielectric layer 103, second dielectric layer 105, and etch stop layer 107. These are formed on an adjacent portion of a substrate 109, which a portion may be an underlying metallization layer or a gate electrode layer (at the device level).

After deposition of the second dielectric layer 105, the process forms a via mask 111 having openings where vias will be subsequently etched. FIG. 1B shows an example of a cross-sectional schematic of the one or more dielectric layers in FIG. 1A after an etch has been performed in the damascene process. Next, vias are partially etched down through the level of etch stop 107. Then via mask 111 is stripped off and replaced with a line mask 113 as depicted in FIG. 1B. A second etch operation is performed to remove sufficient amounts of dielectric to define line paths 115 in second dielectric layer 105. The etch operation also extends via holes 117 through first dielectric layer 103, down to contact the underlying substrate 109 as illustrated in FIG. 1B.

Thereafter, the process forms a thin layer of relatively conductive barrier layer material 119 on the exposed surfaces (including sidewalls) of dielectric layers 103 and 105. FIG. 1C shows an example of a cross-sectional schematic of the dielectric layers in FIGS. 1A and 1B after the etched regions have been coated with a conductive barrier layer material and filled with metal in the damascene process. Conductive barrier layer material 119 may be formed, for example, of tantalum nitride or titanium nitride. A chemical vapor deposition (CVD) or physical vapor deposition (PVD) operation is typically employed to deposit the conductive barrier layer material 119.

On top of the conductive barrier layer material 119, the process then deposits conductive metal 121 (typically, though not necessarily, copper) in the via holes and line paths 117 and 115. Conventionally this deposition is performed in two steps: an initial deposition of a metal seed layer followed by bulk deposition of metal by plating. However, the present disclosure provides a pre-treatment step prior to the bulk deposition step, as described in detail below. The metal seed layer may be deposited by PVD, CVD, electroless plating, or any other suitable deposition technique known in the art. Note that the bulk deposition of copper not only fills line paths 115 but, to ensure complete filling, covers all the exposed regions on top of second dielectric layer 105. The metal 121 may serve as copper interconnects for IC devices. In some embodiments, metals other than copper are used in the seed layer. Examples of such other metals include cobalt, tungsten, and ruthenium.

Metal seed layers can readily react with oxygen or water vapor in the air and oxidize from a pure metal into a mixed film of a metal oxide and a buried pure metal. While the oxidation under ambient conditions may be limited to a thin surface layer of some metals, that thin layer may represent a significant fraction or perhaps the entire thickness of thin seed layers used in current technology nodes. The relatively thin layers may be necessitated by the technology node, such as the 4×nm node, the 3×nm node, the 2×nm node, and the 1×nm node, and less than 10 nm. The height to width aspect ratio of vias and trenches in technology nodes necessitating relatively thin metal layers can be about 5:1 or greater. In such technology nodes, the thickness of the metal seed layer can be less than about 100 Å on average as a result. In some implementations, the thickness of the metal seed layer can be less than about 50 Å on average.

Through the general chemical reactions shown in Equation 1 and Equation 2 below, metals used for seed or barrier layers are converted to metal oxides (Mox), though the exact reaction mechanisms between the metal surfaces (M) and ambient oxygen or water vapor can vary depending on the properties and the oxidation state.

$$2M_{(s)} + O_{2(g)} \rightarrow 2MOx_{(s)} \quad \text{Equation 1}$$

$$2M_{(s)} + H_2O_{(g)} \rightarrow M_2Ox + H_{2(g)} \quad \text{Equation 2}$$

For example, copper seed deposited on substrates is known to rapidly form copper oxide upon exposure to the air. A copper oxide film can form a layer that is approximately 20 Å and upwards to 50 Å thick on top of underlying copper metal. As metal seed layers become thinner and thinner, the formation of metal oxides from oxidation in ambient conditions can pose significant technical challenges.

Conversion of pure metal seed to metal oxide can lead to several problems. This is true not only in current copper damascene processing, but also for electrodeposition processes that use different conductive metals, such as ruthenium, cobalt, silver, aluminum, and alloys of these metals. First, an oxidized surface is difficult to plate on. Due to different interactions that electroplating bath additives can have on metal oxide and pure metal, non-uniform plating may result. As a result of the differences in conductivity between a metal oxide and a pure metal, non-uniform plating may further result. Second, voids may form in the metal seed that may make portions of the metal seed unavailable to support plating. The voids may form as a result of dissolution of metal oxide during exposure to corrosive plating solutions. The voids also may form on the surface due to non-uniform plating. Additionally, plating bulk metal on top of an oxidized surface can lead to adhesion or delamination problems, which can further lead to voids following subsequent processing steps, such as chemical mechanical planarization (CMP).

Voids that result from etching, non-uniform plating, delamination, or other means may make the metal seed layer discontinuous, and unavailable to support plating. In fact, because modern damascene metal seed layers are relatively thin, such as about 50 Å or thinner, even a little oxidation may consume an entire layer thickness. Third, metal oxide formation may impede post-electrodeposition steps, such as capping, where the metal oxide may limit adhesion for capping layers.

Figure 2:
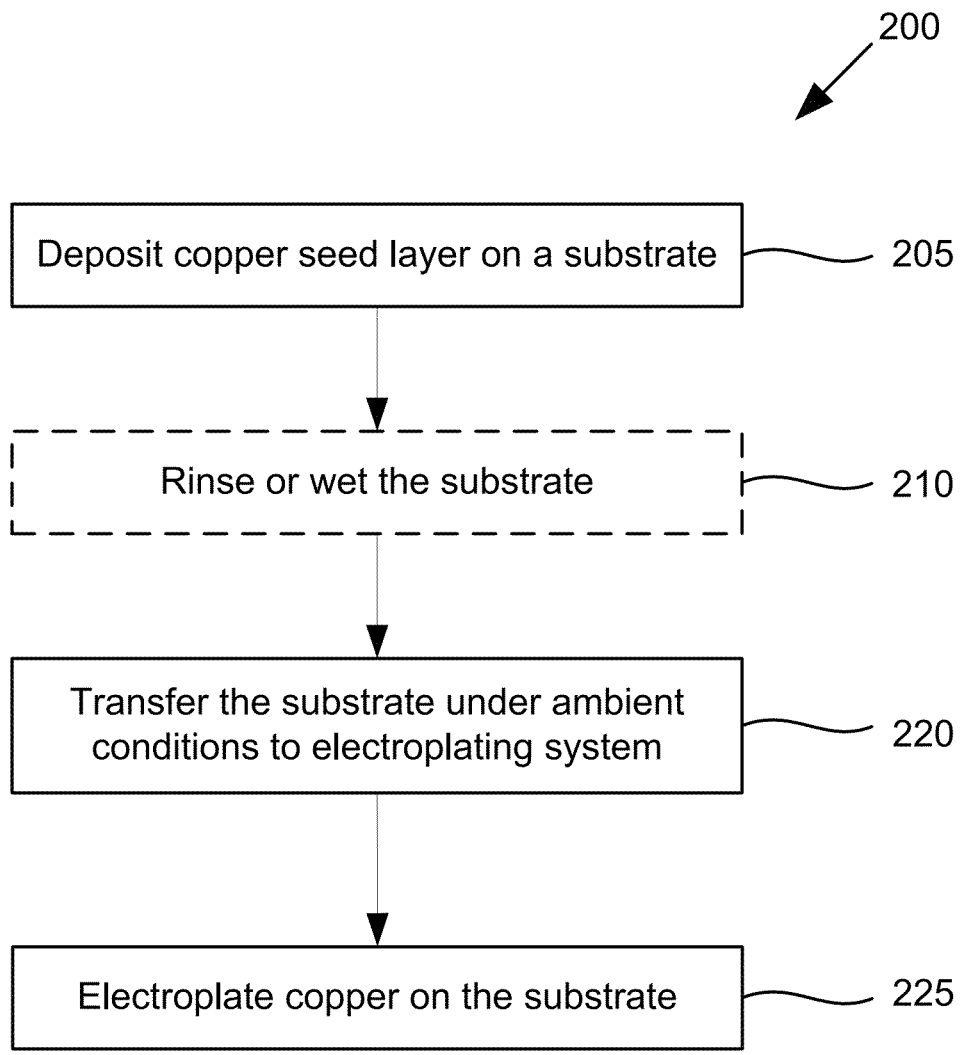
FIG. 2 shows an exemplary flow diagram illustrating a method of electroplating copper on a substrate.

After depositing a metal seed layer but prior to electroplating a bulk metal on the seed layer, it may be difficult to avoid formation of metal oxide on the metal seed layer. Various steps occur prior to electroplating the metal that may expose the metal seed layer to oxygen or water vapor in ambient conditions. For example, FIG. 2 shows an exemplary flow diagram illustrating a method of electroplating copper on a substrate. The process 200 may begin at step 205, where a process chamber or deposition chamber receives a substrate such as a semiconductor wafer. A metal seed layer such as a copper seed layer may be deposited on the substrate using a suitable deposition technique such as PVD.

At optional step 210, the substrate with the metal seed layer may be rinsed and dried. For example, the metal seed layer may be rinsed with de-ionized water. The rinsing step may be limited to a time, for example, of between about 1 and 10 seconds, but may take a longer or shorter time. Subsequently, the substrate may be dried, which can be between about 20 and 40 seconds, though the drying step may take a longer or shorter time. During this step, the metal seed layer may be exposed to oxidation.

At step 215, the substrate with the metal seed layer is transferred to the electroplating system or bath. During this transfer, the metal seed layer may be exposed to ambient conditions such that the metal seed layer may rapidly oxidize. In some embodiments, the duration of this exposure may be anywhere between about 1 minute and about 4 hours, between about 15 minutes and about 1 hour, or more. At step 220, bulk metal may be electroplated on the substrate. A substrate with a copper seed layer, for example, may be immersed in an electroplating bath containing positive ions of copper and associated anions in an acid solution. Step 220 of FIG. 2 can involve a series of processes that is described in U.S. Pat. No. 6,793,796, filed Feb. 28, 2001, the entirety of which is hereby incorporated by reference. The reference describes at least four phases of the electrofilling process and discloses controlled current density methods for each phase for optimal filling of relatively small embedded features.

With various steps that may expose the metal seed layer to oxidation between deposition of the metal seed layer and electroplating, a technique for reducing the negative effects of the metal oxide surfaces is needed. However, some of the current techniques may have drawbacks. Typically, the use of hydrogen-based plasmas may reduce thick metal oxides, but such techniques add substantial costs and utilize substantially high temperatures (e.g., at least over 200° C.) that can badly damage a thin metal seed layer resulting in high void counts within features. A thermal forming gas anneal to reduce thick metal oxides uses a forming gas (e.g., mixture of hydrogen and nitrogen gas) at temperatures higher than 150° C., which can cause metal seed to agglomerate and also lead to increased voiding. The use of acids or other chemical reagents may dissolve or etch thick metal oxides, but removal of such oxides results in increased void formation in regions where metal cannot be plated on, due to the creation of regions with insufficient seed layer where metal cannot be plated on.

The present disclosure provides methods for reducing metal oxide surfaces to modified metal surfaces. The method of reducing the metal oxide surfaces provides a substantially clean metallic surface that is substantially free of oxide when a substrate is introduced into the electroplating bath. In addition, the method of reducing the metal oxide operates in relatively low temperatures, and the reduced metal oxide converts to metal to form a continuous film that is integrated with the metal seed layer and adherent to the underlying seed or substrate.

Process

A method of preparing a substrate with a metal seed layer for electroplating is disclosed. The method includes receiving a substrate having the metal seed layer on a plating surface of the substrate, where a portion of the seed layer has been converted to an oxide of the metal. The substrate may have recesses having height to width aspect ratios of greater than about 3:1 or about 5:1. The method further includes exposing the metal oxide surfaces to a reducing gas atmosphere where the reducing gas atmosphere contains radicals of a reducing gas species. Exposure to the reducing gas atmosphere is conducted in a manner that reduces the oxide of the metal to the metal in the form of a film integrated with the seed layer. In some implementations, the radicals of the reducing gas species come from exposing the reducing gas species to ultraviolet (UV) radiation and/or a plasma. The substrate is maintained at a temperature below a temperature that produces agglomeration of the metal seed layer during exposure to the reducing gas atmosphere. The method further includes transferring the substrate to a plating bath containing a plating solution, and plating metal onto the metal seed layer using the plating solution.

Figure 3:
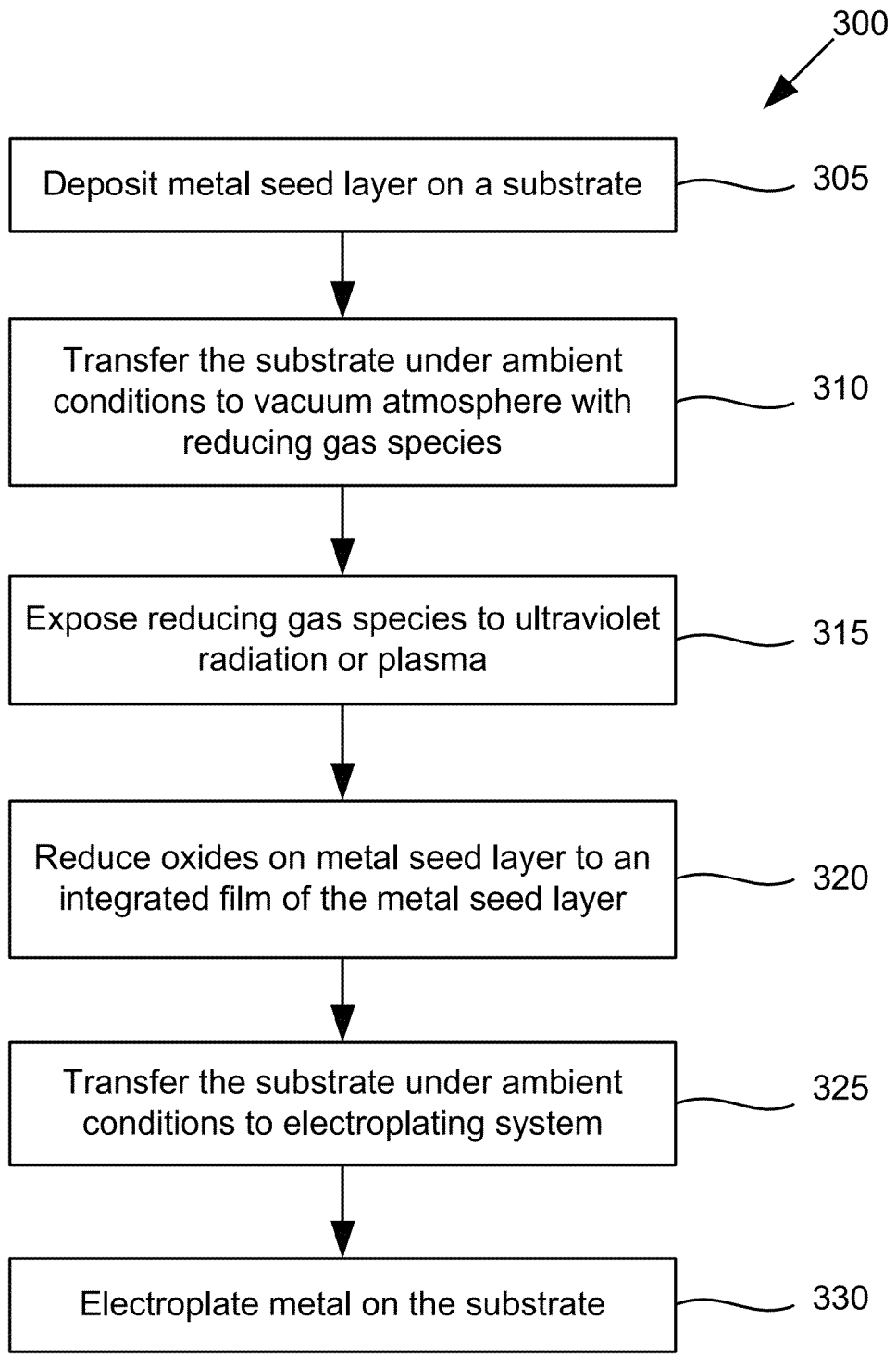
FIG. 3 shows an exemplary flow diagram illustrating a method of reducing metal oxides on a metal seed layer and plating metal on a substrate.

FIG. 3 shows an exemplary flow diagram illustrating a method of reducing oxides on a metal seed layer and plating metal on a substrate. The process 300 can begin with step 305 where a metal seed layer such as a thin copper layer is deposited on a substrate. In some embodiments, the metal seed layer can include a semi-noble metal layer. The semi-noble metal layer may be part of a diffusion barrier or serve as the diffusion barrier. The semi-noble metal layer can include a semi-noble metal, such as ruthenium. Aspects of the semi-noble metal layer can be further described in U.S. Pat. No. 7,442,267, U.S. Pat. No. 7,964,506, U.S. Pat. No. 7,799,684, U.S. patent application Ser. No. 11/540,937, U.S. patent application Ser. No. 12/785,205, and U.S. patent application Ser. No. 13/367,710, each of which is incorporated in its entirety by reference. Step 305 can occur in a deposition apparatus such as a PVD apparatus. The process 300 can continue with step 310 where the substrate is transferred to a chamber or apparatus having a substantially reduced pressure or vacuum environment. The chamber or apparatus can include a reducing gas species. In some embodiments, the reducing gas species can include hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$). During the transfer in step 310, the substrate may be exposed to ambient conditions that can cause the surface of the metal seed layer to oxidize.

At step 315, while the substrate is in the reduced or vacuum environment, the reducing gas species may be exposed to UV radiation or a plasma. The UV radiation or plasma may generate radicals of the reducing gas species, such as, for example, $H^*$, $NH_2^*$, or $N_2H_3^*$. The radicals of the reducing gas species react with the metal oxide surface to generate a pure metallic surface. As demonstrated below, Equation 3 shows an example a reducing gas species such as hydrogen gas being broken down into hydrogen radicals. Equation 4 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 5.

$$H_2 \rightarrow 2H^* \quad \text{Equation 3}$$

$$(x)2H^* + MOx \rightarrow M + (x)H_2O \quad \text{Equation 4}$$

$$xH_2 + MOx \rightarrow M + xH_2O \quad \text{Equation 5}$$

The radicals of the reducing gas species or the reducing gas species itself reacts with the metal oxide under conditions that convert the metal oxide to metal in the form of a film integrated with the metal seed layer, as shown in step 320. Characteristics of the film integrated with the metal seed layer are discussed in further detail with respect to FIG. 4D below.

The process conditions for converting the metal oxide to metal in the form of a film integrated with the metal seed layer can vary depending on the choice of metal and/or on the choice of the reducing gas species. In some embodiments, the reducing gas species can include at least one of $H_2$, $NH_3$, CO, carbon and/or hydrocarbons, $B_2H_6$, sulfite compounds, phosphites, and $N_2H_4$. In addition, the reducing gas species can be combined with mixing gas species, such as relatively inert gas species. Examples of relatively inert gas species can include nitrogen ($N_2$), helium (He), neon (Ne), krypton (Kr), xenon (Xe), radon (Rn), and argon (Ar). The flow rate of the reducing gas species can vary depending on the size of the wafer for processing. For example, the flow rate of the reducing gas species can be between about 10 standard cubic centimeter per minute (sccm) and about 100,000 sccm for processing a single 450 mm wafer. Other wafer sizes can also apply. For example, the flow rate of the reducing gas species can be between about 5,000 and about 30,000 standard liters per minute (slm) for processing a single 300 mm wafer.

Processing conditions such as temperature and pressure in the reducing chamber can also be controlled to permit conversion of the metal oxide to metal in the form of a film integrated with the metal seed layer. In some embodiments, the temperature of the reducing chamber can be relatively high to permit the dissociation of reducing gas species into radicals. For example, the reducing chamber can be anywhere between about 10° C. and about 500° C., such as between about 50° C. and about 250° C. Higher temperatures may be used to speed up metal oxide reduction reactions and shorten the duration of exposure to the reducing gas atmosphere. In some embodiments, the reducing chamber can have a relatively low pressure to substantially remove any oxygen from the reducing gas atmosphere, as minimizing the presence of oxygen in the atmosphere can reduce the effects of reoxidation. For example, the reducing chamber can be pumped down to a vacuum environment or a reduced pressure of between about 0.1 Torr and about 50 Torr.

Although the reducing chamber can have a relatively high temperature to permit the dissociation of reducing gas species into radicals, the temperature of the substrate itself may be separately controlled to avoid or reduce damage to the metal seed layer. Depending on the type of metal in the metal seed layer, the metal can begin to agglomerate above a threshold temperature. The effects of agglomeration is more pronounced in relatively thin seed layers, especially in seed layers having a thickness less than about 100 Å. Agglomeration includes any coalescing or beading of a continuous or semi-continuous metal seed layer into beads, bumps, islands, or other masses to form a discontinuous metal seed layer. This can cause the metal seed layer to peel away from the surface upon which it is disposed and can lead to increased voiding during plating. For example, the temperature at which agglomeration begins to occur in copper is greater than about 100° C. Different agglomeration temperatures may be appropriate for different metals.

To control the temperature of the substrate and avoid or reduce the effects of agglomeration, a cooling system such as an actively cooled pedestal and/or gas flow cooling apparatus in the reducing chamber can be used to keep the local area of the substrate at temperatures below the agglomeration temperature. In some embodiments, the substrate may be supported upon and directly in contact with the pedestal. In some embodiments, a gap may exist between the pedestal and the substrate. Heat transfer can occur via conduction, convention, radiation, or combinations thereof.

In some implementations, an actively cooled pedestal provides a heat transfer element with resistive heating elements, cooling channels, or other heat sources or sinks embedded within the pedestal. For example, the pedestal can include cooling elements that permit a fluid such as water to circulate within the pedestal and actively cool the pedestal. In some embodiments, the cooling elements can be located outside the pedestal. In some embodiments, the cooling fluid can include a low-boiling fluid, such as glycols. Embodiments that include such cooling elements can be described in U.S. Pat. No. 7,327,948, issued Feb. 5, 2008; U.S. Pat. No. 7,941,039, issued Jan. 5, 2011; U.S. patent application Ser. No. 11/751,584, filed May 21, 2007; U.S. patent application Ser. No. 13/370,579, filed Feb. 10, 2012; and U.S. Pat. No. 8,137,465, issued Mar. 20, 2012, each of which are incorporated herein by reference in its entirety and for all purposes. Temperature in the pedestal can be actively controlled using a feedback loop.

In some implementations, a gap can exist between the pedestal and the substrate, and a conductive media such as gas can be introduced between the pedestal and the substrate to cool the substrate. In some embodiments, the conductive media can include helium. In some embodiments, the pedestal can be convex or concave to promote uniform cooling across the substrate. Examples of pedestal profiles can be described in U.S. patent application Ser. No. 11/129,266, filed May 12, 2005; U.S. patent application Ser. No. 11/546,189, filed Oct. 10, 2006; and U.S. patent application Ser. No. 12/749,170, filed Mar. 29, 2010, each of which is incorporated herein by reference in its entirety and for all purposes.

Different configurations can be utilized to efficiently cool and to maintain a substantially uniform temperature across the substrate. Some implementations of an active cooling system include a pedestal circulating water within the pedestal coupled with a uniform gas flow across the substrate. Other implementations include a pedestal resistively heated coupled with a uniform gas flow across the substrate. Other configurations and/or additions may also be provided with the active cooling system. For example, a removable ceramic cover can be inserted between the pedestal and the substrate to promote substantially uniform temperature across the substrate, as described in U.S. patent application Ser. No. 13/086,010, filed Apr. 13, 2011, which is incorporated herein by reference in its entirety and for all purposes. In some embodiments, gas flow can be controlled with minimum contact supports to rapidly and uniformly cool the substrate, as described in U.S. Pat. No. 8,033,771, issued Oct. 11, 2011, which is incorporated herein by reference in its entirety and for all purposes. In some embodiments, the heat transfer coefficient of the conductive media can be adjusted by varying the partial pressure of the conductive media as described in U.S. Pat. No. 8,288,288, issued Oct. 12, 2012, which is incorporated herein by reference in its entirety and for all purposes. Other configurations for a localized cooling system for maintaining a relatively low substrate temperature can be utilized as is known in the art.

The temperature of the substrate can be maintained at a temperature below the agglomeration temperature of the metal using any of the cooling systems discussed earlier herein or as is known in the art. In some embodiments, the substrate can be maintained at a temperature between about −10° C. and about 150° C. In copper seed layers, for example, the substrate can be maintained at a temperature between about 75° C. and about 100° C.

The duration of exposure to the reducing gas atmosphere can vary depending on the other process parameters. For example, the duration of exposure to the reducing gas atmosphere can be shortened by increasing UV intensity, remote plasma power, temperature of the reducing chamber, etc. In certain embodiments, the duration of the exposure to reduce the metal oxide surfaces to pure metal in an integrated film with the metal seed layer can be between about 1 second and about 60 minutes. For example, for pretreatment of copper seed layers, the duration of the exposure can between about 10 seconds and about 60 seconds.

Table I summarizes the process conditions in the reducing chamber for reduction of metal oxides to metal in the form of a film integrated with the metal seed layer.

TABLE I

| Process Parameter | Type or Range |
| --- | --- |
| Reducing Gas Species | $H_2$, $NH_3$, $N_2H_4$ carbon and/or hydrocarbons, $B_2H_6$, sulfite compounds, phosphites |
| Mixing Gas Species | $N_2$, He, Ar, Xe, Ne, Kr, Rn |
| Gas Flow Rate | 10 sccm-100,000 sccm |
| Reducing Chamber Temperature | 10° C.-500° C. |
| Reducing Chamber Pressure | 0.1 Torr-50 Torr |
| Substrate Pedestal Temperature | −10° C.-150° C. |
| Exposure Time | 1 second-60 minutes |

While most reducing treatments may require that the substrate be rinsed and dried prior to electroplating in order to clean the substrate surface, the substrate as exposed to a reducing gas atmosphere need not be rinsed and dried prior to electroplating. Thus, reducing metal oxide surfaces using a reducing gas atmosphere can avoid the additional step of rinsing and drying the substrate before electroplating, which can further reduce the effects of reoxidation.

At step 325 in FIG. 3, the substrate may be transferred under ambient conditions to the electroplating system or other pretreating apparatus. Though metal oxides in the metal seed layer have been substantially reduced by exposing the metal oxide surfaces to a reducing gas atmosphere, performing step 325 may present an additional challenge of reoxidation from exposure to the ambient environment. In some embodiments, exposure to ambient conditions may be minimized using techniques such as shortening the duration of transfer or controlling the atmosphere during transfer. Additionally or alternatively, the transfer is conducted in a controlled environment that is less oxidizing than ambient conditions. To control the atmosphere during transfer, for example, the atmosphere may be substantially devoid of oxygen. The environment may be substantially inert and/or be low pressure or vacuum. At step 330, metal may be electroplated on to the substrate.

Figure 4A:
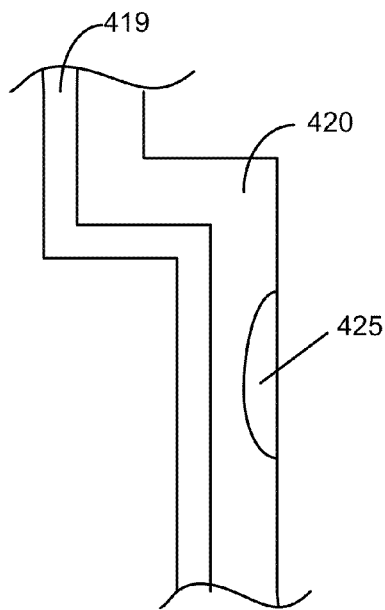
FIG. 4A shows an example of a cross-sectional schematic of an oxidized metal seed layer.

FIGS. 4A-4D show examples of cross-sectional schematics of a metal seed layer deposited on a conductive barrier layer. FIG. 4A shows an example of a cross-sectional schematic of an oxidized metal seed layer deposited over a conductive barrier layer 419. As discussed earlier herein, the metal seed layer 420 may be oxidized upon exposure to oxygen or water vapor in ambient conditions, which can convert metal to a metal oxide 425 in a portion of the metal seed layer 420.

Figure 4B:
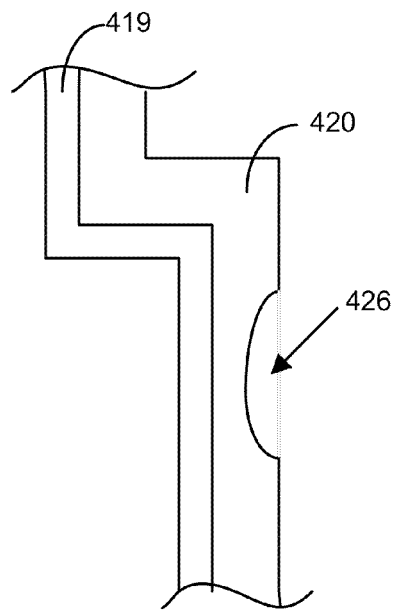
FIG. 4B shows an example of a cross-sectional schematic of a metal seed layer with a void due to removal of metal oxide.

FIG. 4B shows an example of a cross-sectional schematic of a metal seed layer with a void due to removal of metal oxide. As discussed earlier herein, some solutions treat the metal oxide 425 by removal of the metal oxide 425, resulting in voids 426. For example, the metal oxide 425 can be removed by oxide etching or oxide dissolution by an acid or other chemical. Because the thickness of the void 426 can be substantially large relative to the thinness of the metal seed layer 420, the effect of the void 426 on subsequent plating can be significant.

Figure 4C:
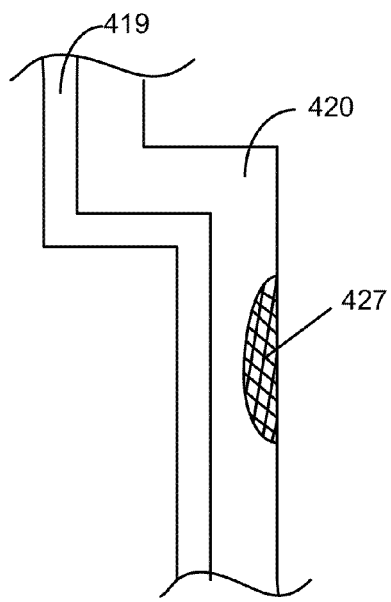
FIG. 4C shows an example of a cross-sectional schematic of a metal seed layer with reduced metal oxide forming a reaction product not integrated with the metal seed layer.

FIG. 4C shows an example of a cross-sectional schematic of a metal seed layer with reduced metal oxide forming a reaction product not integrated with the metal seed layer. As discussed earlier herein, some solutions reduce the metal oxide 425 under conditions that agglomerate metal with the metal seed layer 420. In some embodiments, reducing techniques generate metal particles 427, such as copper powder, that can agglomerate with the metal seed layer 420. The metal particles 427 do not form an integrated film with the metal seed layer 420. Instead, the metal particles 427 are not continuous, conformal, and/or adherent to the metal seed layer 420.

Figure 4D:
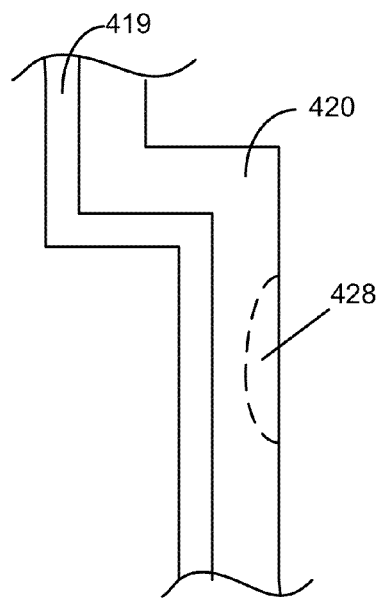
FIG. 4D shows an example of a cross-sectional schematic of a metal seed layer with reduced metal oxide forming a film integrated with the metal seed layer.

FIG. 4D shows an example of a cross-sectional schematic of a metal seed layer with reduced metal oxide forming a film integrated with the metal seed layer. In some embodiments, radicals from a reducing gas species or the reducing gas species itself can reduce the metal oxide 425. When process conditions for the reducing gas atmosphere are appropriately adjusted, the metal oxide 425 in FIG. 4A may convert to a film 428 integrated with the metal seed layer 420. The film 428 is not a powder. In contrast to the example in FIG. 4C, the film 428 can have several properties that integrate it with the metal seed layer 420. For example, the film 428 can be substantially continuous and conformal over the contours metal seed layer 420. Moreover, the film 428 can be substantially adherent to the metal seed layer 420, such that the film 428 does not easily delaminate from the metal seed layer 420.

Figure 5:
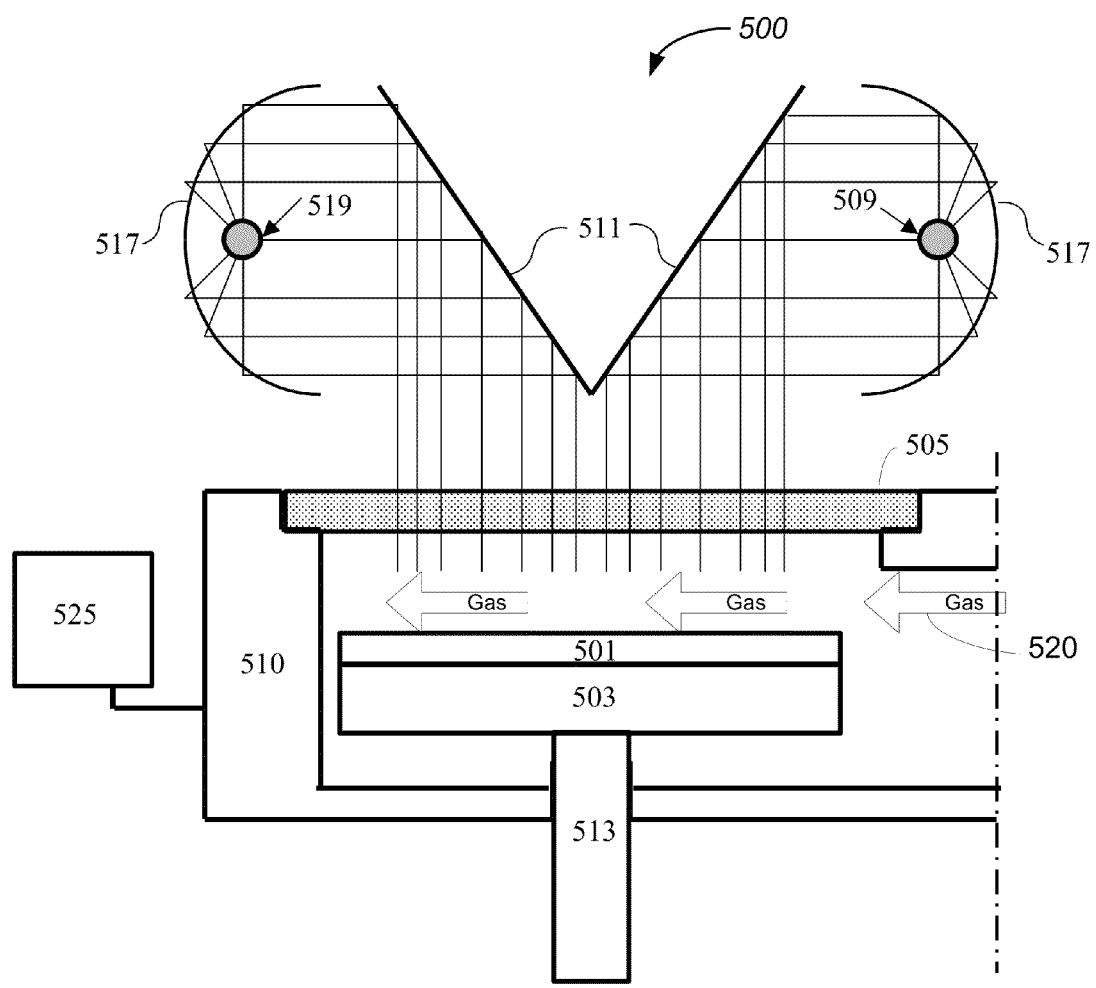
FIG. 5 shows an example of a schematic diagram of an ultraviolet (UV) radiation apparatus with a reducing chamber.

FIG. 5 shows an example of a schematic diagram of an ultraviolet (UV) radiation apparatus with a reducing chamber. The UV radiation apparatus 500 includes a pedestal 503 in a reducing chamber 510 that serves to support a substrate 501. The pedestal 503 may be movable between a raised and lowered position via shaft 513. The pedestal 503 may be actively cooled by a cooling system described earlier herein to maintain the substrate 501 at a temperature below a temperature that produces agglomeration of metal in a metal seed layer on the substrate 501.

Reducing gas species 520 can enter the reducing chamber 510 via a gas inlet (not shown). The amount of gas introduced in the reducing chamber 510 may be controlled by valves and mass flow controllers (not shown). During operation, the reducing gas species 520 may be exposed to UV radiation emitted from UV light sources 509 and 519 for a set period of time. The substrate 501 may be concomitantly exposed to UV radiation emitted from UV light sources 509 and 519.

A window 505 can be positioned approximately above the pedestal 510 to permit radiation of the desired wavelengths from UV light sources 509 and 519 into the reducing chamber 510. The window 505 may be made of quartz, sapphire, or other suitable material. Filters (not shown) may also be used to remove unwanted spectral components. Suitable UV light sources 509 and 519 may include, but are not limited to, mercury lamps, deuterium lamps, pulsed xenon lamps, excimer lamps, and excimer lasers. Such lamps/lasers may be tuned to provide an emission spectrum to break down and/or excite certain reducing gas species 520.

UV light sources 509 and 519 coupled with the window 505 may produce radiation with wavelengths less than about 400 nm, or between about 100 nm and about 400 nm. The wavelength of UV radiation may have sufficient energy to break apart the reducing gas species 520 into radicals capable of reducing metal oxides. UV radiation is absorbed by the covalent bonds of reducing gas species 520, which can cause the covalent bonds to break.

In some embodiments, the reducing gas species includes ammonia. N—H bonds in ammonia may be broken down at wavelengths between about 225 nm and about 275 nm. Therefore, a UV lamp with a broadband spectrum may emit a wavelength between about 200 nm and about 300 nm to radicalize ammonia or other reducing gas species 520. In embodiments where the reducing gas species includes hydrogen, the wavelength of UV radiation can be between about 120 nm and about 170 nm to sufficiently break down hydrogen gas molecules.

Moreover, the wavelength of UV radiation may also have sufficient energy to activate the metal oxide surface of the substrate 501. In some embodiments, the UV radiation may cause the metal oxide surface of the substrate 501 to become unstable so as to more readily react with radicals of the reducing gas species 520 or the reducing gas species 520 itself. While the choice of the UV light source may be tuned for radicalization of a select reducing gas species, it is understood that the UV light source may also be tuned for activation of a select metal oxide surface.

UV light sources 509 and 519 can include broadband UV lamps, such as mercury lamps. For example, broadband UV lamps can emit wavelengths between about 200 nm and about 300 nm. Medium pressure mercury arc lamps are used in some embodiments. Mercury lamps emit a steady discharge with the typical emission lines of a mercury vapor spectrum including a fairly intense line at about 254 nm. Mercury vapor lamps also exhibit significant radiant output in wavelengths down to about 220 nm. Microwave-powered mercury lamps may also be used, and adjustment of UV intensity may be achieved through modulation of the microwave energy that is coupled into the lamp bulb.

UV light sources 509 and 519 can also include UV excimer lamps or UV excimer lasers. Xenon excimer lamps are used in some embodiments. Such lamps emit UV radiation at about 172 nm and do not contain environmentally undesirable elements such as mercury. Some xenon excimer lamps include a phosphor composition that can generate UV radiation between about 190 nm and about 195 nm.

In some embodiments, "cold mirrors" or filters may be used to tailor the spectrum of the radiation emitted from the UV light sources 509 and 519. As illustrated in the example in FIG. 5, reflectors 507, 517, and 511 can reflect the wavelengths that are desired for dissociating the reducing gas species 520 and/or activating the metal oxide surfaces. For example, the reflectors 507, 517, and 511 may be made from "cold mirror" materials, i.e., they may be designed transmit infrared (IR) and reflect UV radiation. However, it may be understood that in some embodiments, the UV radiation apparatus 500 may not be equipped with any reflectors.

The UV intensity entering the reducing chamber 510 can be directly controlled by the type of light source and by the power applied to the light source or array of light sources. In various embodiments, the UV intensity can be characterized as about 40% or greater of the total lamp power applied, such as about 60% of the total lamp power applied. Factors influencing the intensity of the total lamp applied power include, for example, the number or light sources (e.g., in an array of light sources) and the light source types (e.g., lamp type or laser type). In some embodiments, the total lamp power of the UV light sources 509 and 519 can be configured to generate power between about 1 mW/cm$^2$ and about 20 W/cm$^2$ (or UV intensity between about 0.6 mW/cm$^2$ and about 12 W/cm$^2$). The intensity of the UV light sources 509 and 519 can be based in part on the type of reducing gas species 520 to be radicalized. In some embodiments, for radicalization of ammonia, the UV intensity may be between about 1 W/cm$^2$ and about 10 W/cm$^2$.

Other methods of controlling the UV intensity entering the reducing chamber 510 include using filters that can block portions of light from reaching the reducing chamber 510. As with the direction of light, the intensity of light can be modulated using various optical components such as mirrors, lenses, diffusers and filters. Additionally, another method of controlling the UV intensity reaching the substrate 501 can include adjusting the distance between the UV light sources 509 and 519 and the substrate 501. For example, the pedestal 503 may be movable between a raised position and a lowered position via shaft 513, so that more UV radiation strikes the substrate 501 at a raised position and less UV radiation strikes the substrate 501 at a lowered position.

In FIG. 5, the UV radiation apparatus 500 may actively cool and maintain the temperature of the substrate 501 using an active cooling system or pedestal 503. Though the use of UV light sources 509 and 519 also increases the temperature in the reducing chamber 510 and at the substrate 501, the UV radiation apparatus 500 actively maintains a controlled temperature at the substrate 501 using a cooling system described earlier herein or as is known in the art. For example, the temperature of the substrate 501 can be actively maintained at about or below 100° C. for copper seed layers.

In certain embodiments, a system controller 525 is employed to control process conditions for the UV exposure process. The controller 525 will typically include one or more memory devices and one or more processors. The processor may include a CPU or computer, analog and/or digital input/output connections, stepper motor controller boards, etc. Aspects of the controller 525 may be further described with respect to the controller in FIG. 7.

It should be understood that the UV radiation apparatus 500 depicted in FIG. 5 is only an example of a suitable apparatus and that other designs for a UV radiation apparatus may be used. Examples may be described in U.S. Pat. No. 8,137,465, issued Mar. 20, 2012; U.S. Pat. No. 7,265,061, issued Sep. 4, 2007; U.S. patent application Ser. No. 10/972,084, filed Oct. 22, 2004, U.S. Pat. No. 7,851,232, issued Dec. 14, 2010; U.S. Pat. No. 8,242,028, issued Aug. 14, 2012; U.S. patent application Ser. No. 12/973,549, filed Dec. 20, 2010; and U.S. Provisional Patent Application No. 61/682,556, filed Aug. 13, 2012, each of which is incorporated herein by reference in its entirety and for all purposes.

Figure 6:
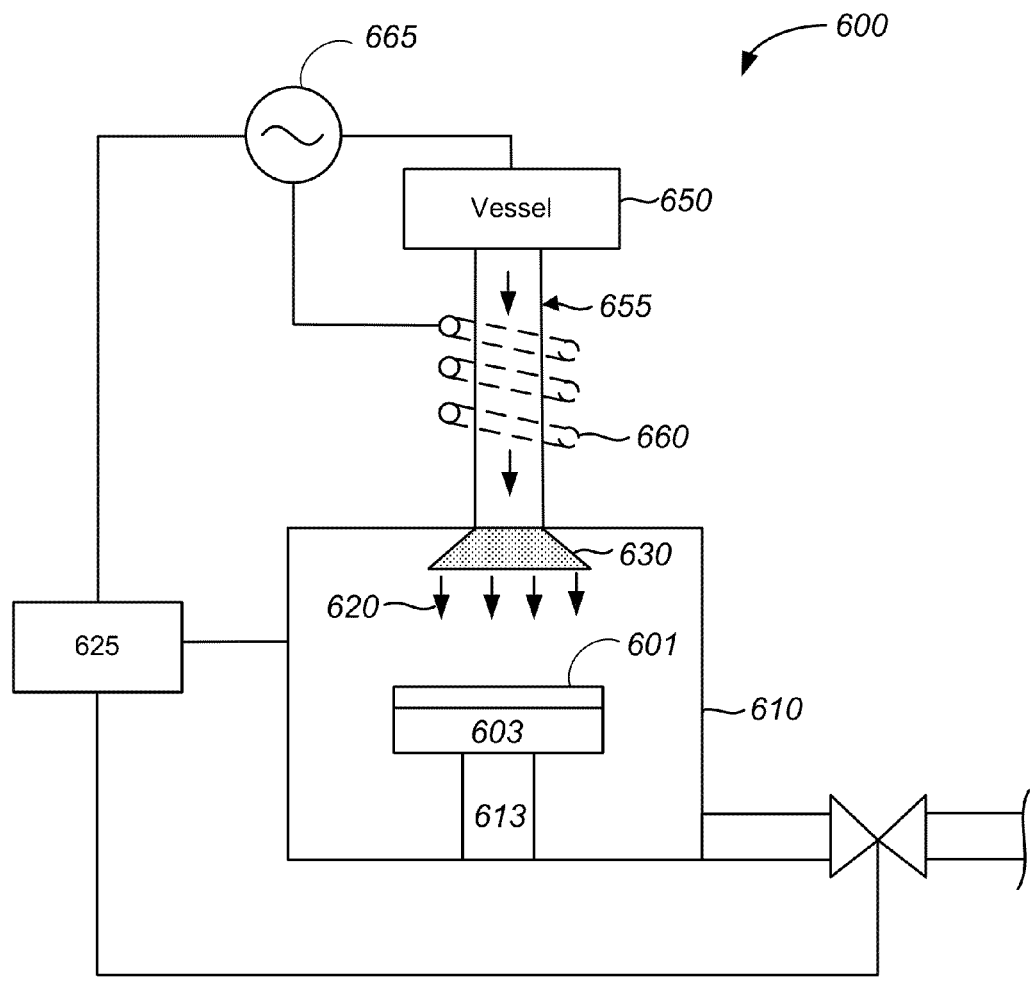
FIG. 6 shows an example of a schematic diagram of a remote plasma apparatus with a reducing chamber.

FIG. 6 shows an example of a schematic diagram of a remote plasma apparatus with a reducing chamber. The remote plasma apparatus 600 includes a reducing chamber 610, a vessel 650, and a remote plasma source 655. The reducing chamber 610 includes a pedestal 603 upon which a substrate 601 may be supported. The pedestal 603 may be movable between a raised and lowered position via shaft 613. The pedestal 603 may be actively cooled by a cooling system described earlier herein to maintain the substrate 601 at a temperature below a temperature that produces agglomeration of metal in a metal seed layer on the substrate 601.

Radicals 620 of a reducing gas species are delivered into the reducing chamber 610 via a showerhead 630. The showerhead 630 distributes radicals 620 of the reducing gas species towards the pedestal 603. In some embodiments, an ion filter (not shown) can be part of the showerhead 630 to remove ions from the flow of radicals 620.

One or more radicals 620 of the reducing gas species may be generated in a remote plasma source 655. The remote plasma source 655 includes a wall surrounded by coils 660. A desired reducing gas species can be provided in a vessel 650 and delivered into the internal volume of the remote plasma source 655. Other vessels (not shown) may provide additional mixing gases to combine with the reducing gas species.

In some embodiments, the remote plasma source 655 may include a radio frequency (RF) power source or microwave power source. An example of a remote plasma source 655 with an RF power source can be found in the GAMMA®, manufactured by Novellus Systems of San Jose, Calif. Another example of an RF remote plasma source 655 can be found in the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used with the remote plasma source 655, as found in the Astex®, also manufactured by MKS Instruments. A microwave plasma can be configured to operate at a frequency of 2.45 GHz.

As illustrated in the example in FIG. 6, an RF generator 665 may be coupled to the coils 660 of the remote plasma source 655. In embodiments with an RF power source, the RF generator 665 may be operated at any suitable power to form a plasma of a desired composition of radical species. Examples of suitable powers include, but are not limited to, powers between about 300 W and about 1500 W. Likewise, the RF generator 665 may provide RF power of a suitable frequency, such as 13.56 MHz for an inductively-coupled plasma.

Reducing gas species are delivered from the vessel 650 through a gas inlet (not shown) and into the internal volume of the remote plasma source 655. The power supplied to the coils 660 can generate a remote plasma with the reducing gas species to form radicals 620 of the reducing gas species. The radicals 620 formed in the remote plasma source 655 can be carried in the gas phase towards the substrate 601 through the showerhead 630. An example of a remote plasma source 655 with such a configuration can be described in U.S. Pat. No. 8,084,339, issued Dec. 27, 2011, which is incorporated herein by reference in its entirety and for all purposes. Other exemplary configurations can be described in U.S. patent application Ser. No. 13/494,836, filed Jun. 12, 2012, which is incorporated herein by reference in its entirety and for all purposes. The radicals 620 can reduce metal oxides on the surface of the substrate 601.

In FIG. 6, the remote plasma apparatus 600 may actively cool and maintain the temperature of the substrate 601 using an active cooling system or pedestal 603. Though the use of remote plasma source 655 also increases the temperature in the reducing chamber 610 and at the substrate 601, the remote plasma apparatus 600 actively maintains a controlled temperature at the substrate 601 using a cooling system described earlier herein or as is known in the art. For example, the temperature of the substrate 601 can be actively maintained at about or below 100° C. for copper seed layers.

A controller 625 may contain instructions for controlling process conditions for the operation of the remote plasma apparatus 600. The controller 625 will typically include one or more memory devices and one or more processors. The processor may include a CPU or computer, analog and/or digital input/output connections, stepper motor controller boards, etc. Aspects of the controller 625 may be further described with respect to the controller in FIG. 7.

It is understood that the use of plasmas to reduce metal oxides is not limited to remote plasma treatments, but can also include the use of direct plasma treatments. Such embodiments of direct plasma treatments may use active cooling systems described earlier herein or as is known in the art to maintain the temperature of the substrate at a relatively low temperature.

Apparatus

Figure 7:
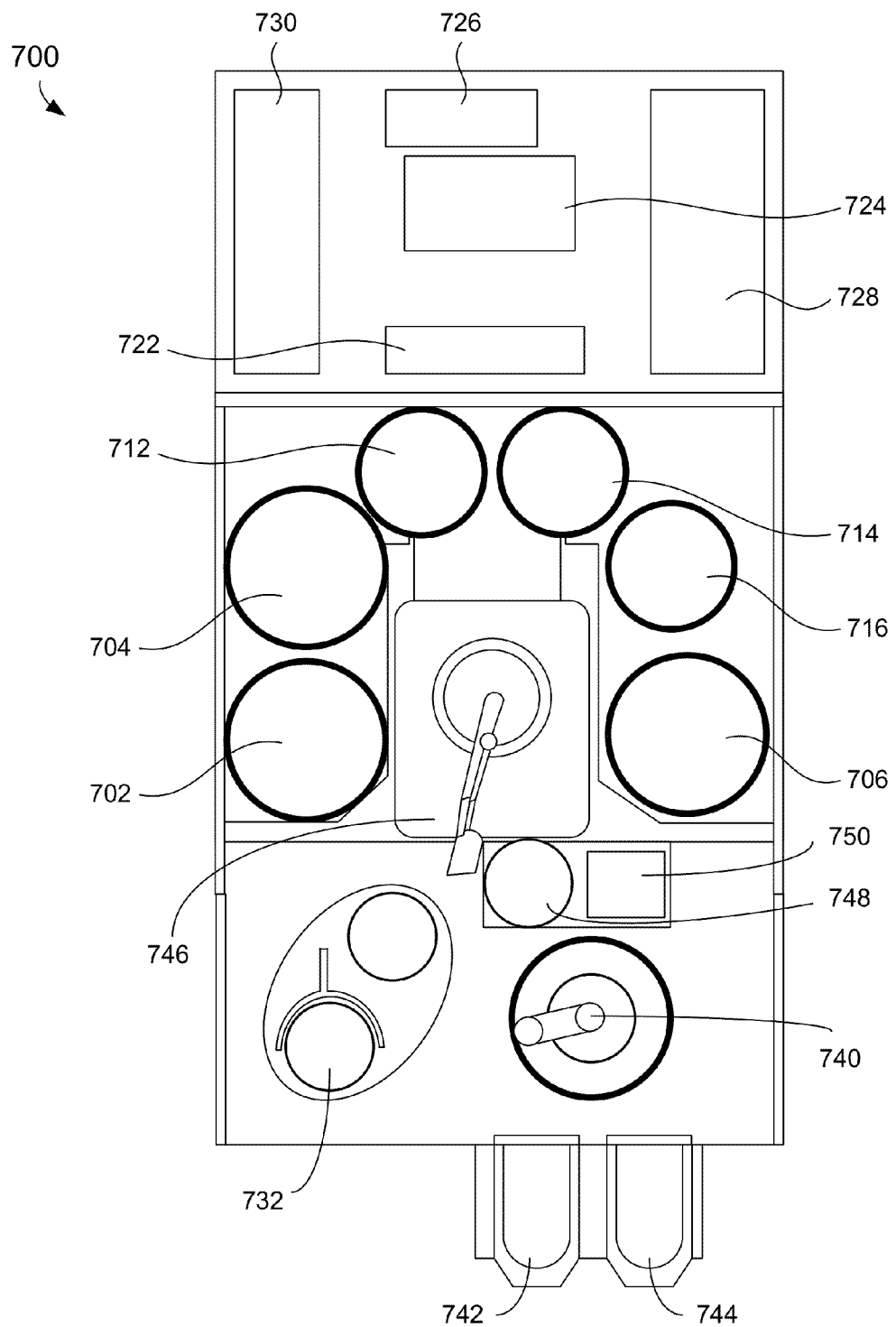
FIG. 7 shows an example of a top view schematic of an electrodeposition apparatus.

Some of the electrodeposition and reducing treatment methods disclosed herein can be described in reference to, and may be employed in the context of, various integrated tool apparatuses. Electrodeposition, reducing, and other methods disclosed herein can be performed in components that form a larger electrodeposition apparatus. FIG. 7 shows a schematic of a top view of an electrodeposition apparatus. The electrodeposition apparatus 700 can include three separate electroplating modules 702, 704, and 706. The electrodeposition apparatus 700 can also include three separate modules 712, 714, and 716 configured for various process operations. For example, in some embodiments, modules 712 and 716 may be spin rinse drying (SRD) modules and module 714 may be an annealing station. In some embodiments, at least one of the modules 712, 714, and 716 may be modified to include pretreatment for reducing metal oxides. In some embodiments, at least one of the electroplating modules 702, 704, and 706 may be modified to integrate pretreatment for reducing metal oxides with plating. In other embodiments, the modules 712, 714, and 716 may be post-electrofill modules (PEMs), each configured to perform a function, such as edge bevel removal, backside etching, and acid cleaning of substrates after they have been processed by one of the electroplating modules 702, 704, and 706.

In some embodiments, the UV radiation apparatus in FIG. 5 or remote plasma apparatus in FIG. 6 may be a separate tool outside any of the modules in the electrodeposition apparatus 700. In some embodiments, the UV radiation apparatus in FIG. 5 or remote plasma apparatus in FIG. 6 may be integrated with any of the modules 712, 714, and 716 configured for pretreatment of the metal seed layer prior to electroplating. The use of SRD modules may be rendered unnecessary after exposure to a reducing gas atmosphere from a UV treatment or remote plasma treatment.

The electrodeposition apparatus 700 includes a central electrodeposition chamber 724. The central electrodeposition chamber 724 is a chamber that holds the chemical solution used as the electroplating solution in the electroplating modules 702, 704, and 706. The electrodeposition apparatus 700 also includes a dosing system 726 that may store and deliver additives for the electroplating solution. A chemical dilution module 722 may store and mix chemicals to be used as an etchant. A filtration and pumping unit 728 may filter the electroplating solution for the central electrodeposition chamber 724 and pump it to the electroplating modules.

In some embodiments, an annealing station 732 may be used to anneal substrates as a pretreatment. The annealing station 732 may include a number of stacked annealing devices, e.g., five stacked annealing devices. The annealing devices may be arranged in the annealing station 732 one on top of another, in separate stacks, or in other multiple device configurations.

A system controller 730 provides electronic and interface controls required to operate the electrodeposition apparatus 700. The system controller 730 (which may include one or more physical or logical controllers) controls some or all of the properties of the electrodeposition apparatus 700. The system controller 730 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 730 or they may be provided over a network. In certain embodiments, the system controller 730 executes system control software.

The system control software in the electrodeposition apparatus 700 may include electrodeposition instructions for controlling the timing, mixture of electrolyte components, inlet pressure, plating cell pressure, plating cell temperature, substrate temperature, current and potential applied to the substrate and any other electrodes, substrate position, substrate rotation, and other parameters performed by the electrodeposition apparatus 700. The system control software may also include reducing instructions for controlling parameters such as the timing, composition of reducing gas species, gas flow rate, chamber temperature, chamber pressure, substrate temperature, substrate positioning, intensity of light emitted by the UV radiation apparatus, wavelength of light emitted by the UV radiation apparatus, power supplied to the remote plasma apparatus, and other parameters performed by the electrodeposition apparatus 700. System control software may be configured in any suitable way. For example, various process tool component sub-routines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an electroplating process may include one or more instructions for execution by the system controller 730, and each phase of the pretreatment or reducing process may include one or more instructions for execution by the system controller 730. In electroplating, the instructions for setting process conditions for an immersion process phase may be included in a corresponding immersion recipe phase. In pretreatment or reducing, the instructions for setting process conditions for exposing the reducing gas species to a UV radiation source or a remote plasma source may be included in a corresponding reducing phase recipe. In some embodiments, the phases of electroplating and reducing processes may be sequentially arranged, so that all instructions for a process phase are executed concurrently with that process phase.

Other computer software and/or programs may be employed in some embodiments. Examples of programs or sections of programs for this purpose include a substrate positioning program, an electrolyte composition control program, a pressure control program, a heater control program, a potential/current power supply control program. Other examples of programs or sections of this program for this purpose include a timing control program, a substrate positioning program, a UV radiation apparatus control program, a remote plasma apparatus control program, a pressure control program, a substrate temperature control program, and a gas atmosphere control program.

In some embodiments, there may be a user interface associated with the system controller 730. The user interface may include a display screen, graphical software displays of the apparatus and/or process conditions, and user input devices such as pointing devices, keyboards, touch screens, microphones, etc.

In some embodiments, the parameters adjusted by the system controller 730 may relate to process conditions for controlling the reducing gas atmosphere. Non-limiting examples of such parameters include temperature of the chamber, pressure of the chamber, temperature of the substrate, duration of exposure, composition of reducing gas species, gas flow rate, power supplied to the remote plasma, intensity of the light emitted by the UV radiation apparatus, substrate position, wavelength of light emitted by the UV radiation apparatus, etc. These parameters may be provided to the user in the form of a recipe, which may be entered utilizing the user interface.

Signals for monitoring the process may be provided by analog and/or digital input connections of the system controller 730 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions, such as temperature of the substrate.

In some embodiments, operations in a reducing chamber or pretreatment chamber that is part of an electroplating system are controlled by a computer system. The computer system may include a system controller including program instructions. The program instructions may include instructions to perform all of the operations needed to reduce metal oxides to metal in a metal seed layer in the form of a film integrated with the metal seed layer.

In one embodiment, the system controller 730 includes instructions for receiving a substrate having a metal seed layer on a plating surface of the substrate, where a portion of the metal seed layer has been converted to an oxide of the metal, and subsequently exposing an oxide of the metal of the metal seed layer to a reducing gas atmosphere that comprises radicals of reducing gas species, where the exposure is performed under conditions that reduce the oxide of the metal to the metal in the form of a film integrated with the metal seed layer. The substrate is maintained at a temperature below a temperature that produces agglomeration of the metal seed layer during exposure to the reducing gas atmosphere. The system controller 730 further includes instructions for transferring the substrate to a plating bath containing a plating solution and electroplating metal onto the metal seed layer using the plating solution.

In some embodiments, the metal can include copper. In some embodiments, the controller further comprises instructions for exposing the reducing gas species to ultraviolet radiation to form radicals of the reducing gas species. The wavelength of the ultraviolet radiation can be between about 100 nm and about 400 nm. In some embodiments, the controller further comprises instructions for exposing the reducing gas species to a remote plasma to form radicals of the reducing gas species.

A hand-off tool 740 may select a substrate from a substrate cassette such as the cassette 742 or the cassette 744. The cassettes 742 or 744 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 740 may hold the substrate using a vacuum attachment or some other attaching mechanism.

The hand-off tool 740 may interface with the annealing station 732, the cassettes 742 or 744, a transfer station 750, or an aligner 748. From the transfer station 750, a hand-off tool 746 may gain access to the substrate. The transfer station 750 may be a slot or a position from and to which hand-off tools 740 and 746 may pass substrates without going through the aligner 748. In some embodiments, however, to ensure that a substrate is properly aligned on the hand-off tool 746 for precision delivery to an electroplating module, the hand-off tool 746 may align the substrate with an aligner 748. The hand-off tool 746 may also deliver a substrate to one of the electroplating modules 702, 704, or 706 or to one of the three separate modules 712, 714, and 716 configured for various process operations.

In some implementations, any of the three separate modules 712, 714, and 716 may be configured to provide a reducing gas atmosphere. The module 712, 714, or 716 may include a support for holding the substrate during a procedure for reducing oxide of a metal, and a region configured to receive and radicalize a reducing gas species. In some embodiments, the module 712, 714, or 716 may include a UV source. The UV source may emit UV radiation having sufficient energy to break apart reducing gas species into radicals in the region configured to receive and radicalize a reducing gas species. The radicals may react with the substrate surface to reduce oxide of the metal. In some embodiments, the module 712, 714, or 716 may include a plasma source. The plasma source may be a remote plasma source or a direct plasma source with sufficient power to break apart reducing gas species into radicals in the region configured to receive and radicalize a reducing gas species. The radicals may react with the substrate surface to reduce oxide of the metal.

In some embodiments, the electrodeposition apparatus 700 may include a component to actively cool the substrate constantly during exposure to the reducing gas atmosphere. In some embodiments, any of the modules 712, 714, and 716 may have a support that is configured to be actively cooled during the procedure for reducing oxide of a metal. This might be done through the substrate backside, for example. Gas flow can provide localized cooling to the substrate during the procedure for reducing oxide of the metal, and/or the support for the substrate may be actively cooled using cooling elements and the like.

Prior to plating, the hand-off tool 746 may transfer a substrate to any one of the pretreatment modules 712, 714, and 716. Any of the modules 712, 714, and 716 may be configured to provide a radicalized reducing gas atmosphere to reduce metal oxides of a metal. The substrate may be treated and transferred via the hand-off tool 746 to any one of the electroplating cells or modules 702, 704, and 706. The electrodeposition apparatus 700 may be configured to allow efficient cycling of substrates through sequential pretreatment, plating, and annealing process operations, which may be useful for implementations in a manufacturing environment. Exposure to the ambient environment may occur between the electroplating module 704 and the annealing module 712 and/or the pretreatment module 714. The pretreatment module 714 may keep the substrate in a reducing gas atmosphere substantially free of any oxygen.

Figure 8:
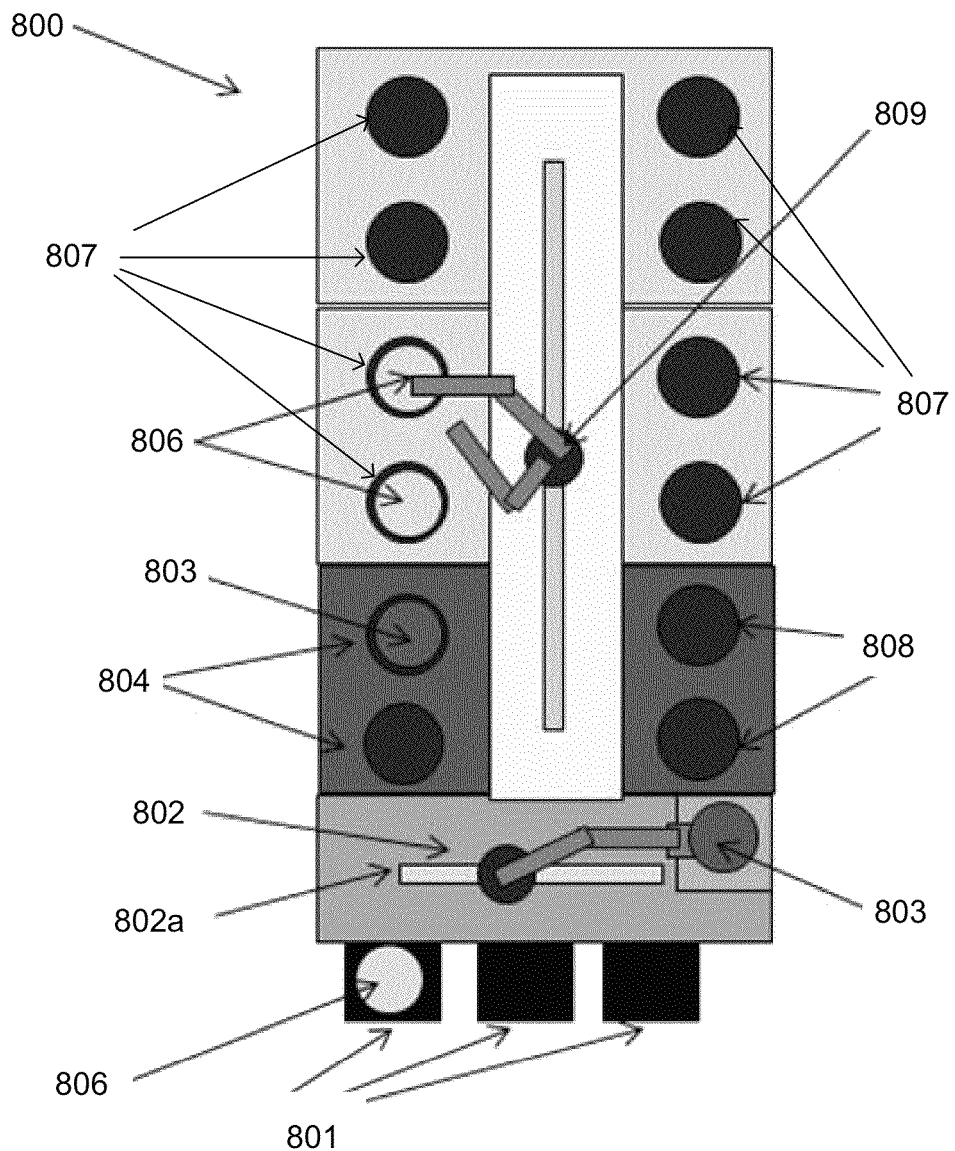
FIG. 8 shows an example of a top view schematic of an automated electrodeposition apparatus having a set of electroplating cells in a duet configuration.

An alternative embodiment of an electrodeposition apparatus 800 is schematically illustrated in FIG. 8. In this embodiment, the electrodeposition apparatus 800 has a set of electroplating cells 807, each containing an electroplating bath, in a paired or multiple "duet" configuration. In addition to electroplating per se, the electrodeposition apparatus 800 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 800 is shown schematically looking top down in FIG. 8, and only a single level or "floor" is revealed in the figure, but it is to be readily understood by one having ordinary skill in the art that such an apparatus, e.g. the Novellus Sabre™ 3D tool, can have two or more levels "stacked" on top of each other, each potentially having identical or different types of processing stations.

Referring once again to FIG. 8, the substrates 806 that are to be electroplated are generally fed to the electrodeposition apparatus 800 through a front end loading FOUP 801 and, in this example, are brought from the FOUP to the main substrate processing area of the electrodeposition apparatus 800 via a front-end robot 802 that can retract and move a substrate 806 driven by a spindle 803 in multiple dimensions from one station to another of the accessible stations—two front-end accessible stations 804 and also two front-end accessible stations 808 are shown in this example. The front-end accessible stations 804 and 808 may include, for example, pretreatment stations, reducing stations, annealing stations, and spin rinse drying (SRD) stations. The front-end accessible stations 804 or 808 may reduce metal oxides of a metal seed layer on a substrate by exposure to a reducing gas atmosphere. In some embodiments, a UV radiation apparatus as described in FIG. 5 or a remote plasma apparatus as described in FIG. 6 may be integrated with the front-end accessible stations 804 or 808. However, it is understood that the UV radiation apparatus in FIG. 5 or the remote plasma apparatus in FIG. 6 may be a separate tool outside of the electrodeposition apparatus 800. Lateral movement from side-to-side of the front-end robot 802 is accomplished utilizing robot track 802a. Each of the substrates 806 may be held by a cup/cone assembly (not shown) driven by a spindle 803 connected to a motor (not shown), and the motor may be attached to a mounting bracket 809. Also shown in this example are the four "duets" of electroplating cells 807, for a total of eight electroplating cells 807. A system controller (not shown) may be coupled to the electrodeposition apparatus 800 to control some or all of the properties of the electrodeposition apparatus 800. The system controller may also be programmed or otherwise configured to execute instructions according to processes described earlier herein.

The front-end robot 802 may transfer the substrate 806 to any one of the front-end accessible stations 804 and 808. The front-end accessible station 804 or 808 may include a support for holding the substrate during a procedure for reducing oxide of a metal, and a region configured to receive and radicalize a reducing gas species. In some embodiments, the front-end accessible station 804 or 808 may include a UV source. The UV source may emit UV radiation having sufficient energy to break apart reducing gas species into radicals in the region configured to receive and radicalize a reducing gas species. The radicals may react with the substrate surface to reduce oxide of the metal. In some embodiments, the front-end accessible station 804 or 808 may include a plasma source. The plasma source may be a remote plasma source or a direct plasma source with sufficient power to break apart reducing gas species into radicals in the region configured to receive and radicalize a reducing gas species. The radicals may react with the substrate surface to reduce oxide of the metal.

In some embodiments, the electrodeposition apparatus 800 may include a component to actively cool the substrate 806 constantly during exposure to the reducing gas atmosphere. In some embodiments, any of the front-end accessible stations 804 and 808 may have a support that is configured to be actively cooled during the procedure for reducing oxide of a metal. This might be done through the substrate backside, for example. Gas flow can provide localized cooling to the substrate 806 during the procedure for reducing oxide of the metal, and/or the support for the substrate 806 may be actively cooled using cooling channels and the like.

Prior to plating, the front-end robot 802 may transfer a substrate 806 to any one of the front-end accessible stations 804 and 808. Any of the front-end accessible stations 804 and 808 may be configured to provide a radicalized reducing gas atmosphere to reduce metal oxides of a metal. The substrate 806 may be treated and transferred via the front-end robot 802 to any one of the electroplating cells 807. The electrodeposition apparatus 800 may be configured to allow efficient cycling of substrates through sequential pretreatment, plating, and annealing process operations, which may be useful for implementations in a manufacturing environment. Exposure to the ambient environment may occur between the electroplating cell 807 and the front-end accessible station 804 or 808. The front-end accessible station 804 or 808 may keep the substrate 806 in a reducing gas atmosphere substantially free of any oxygen.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

EXAMPLES

Samples of copper seeded trench coupons were exposed to a reducing gas atmosphere containing radicals of reducing gas species under various conditions to determine the effectiveness of the reducing gas atmosphere in reducing copper oxide and avoiding void formation. Each of the samples of the copper seeded trench coupons had trenches with a width of about 48 nm each. Optimized copper seeded trench coupons utilized samples where the seed condition provided excellent fill. Marginal copper seeded trench coupons utilized samples where the seed condition provided thin seed coverage. The marginal copper seeded trench coupons generally result in very large bottom voids. The marginal copper seeded trench coupons represent extreme samples that are typically not found on production wafers, but can more effectively indicate the ability of reducing agent treatment in reducing copper oxide and preventing void formation.

Figure 9A:
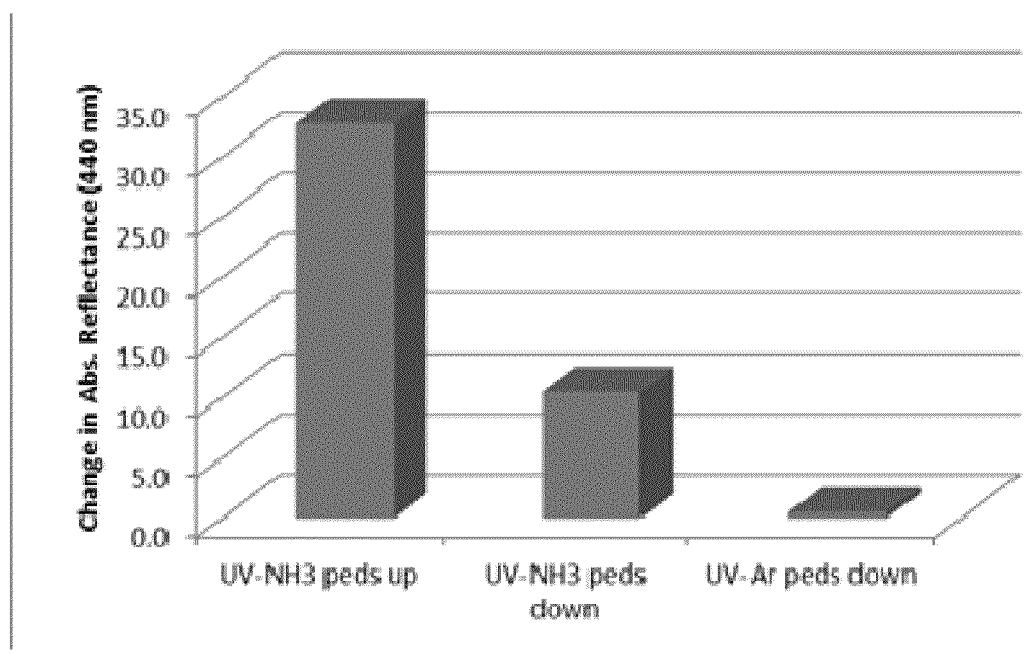
FIG. 9A shows a graph illustrating the effects of exposure to UV radiation and UV intensity with the change in reflectivity of copper.
Figure 9B:
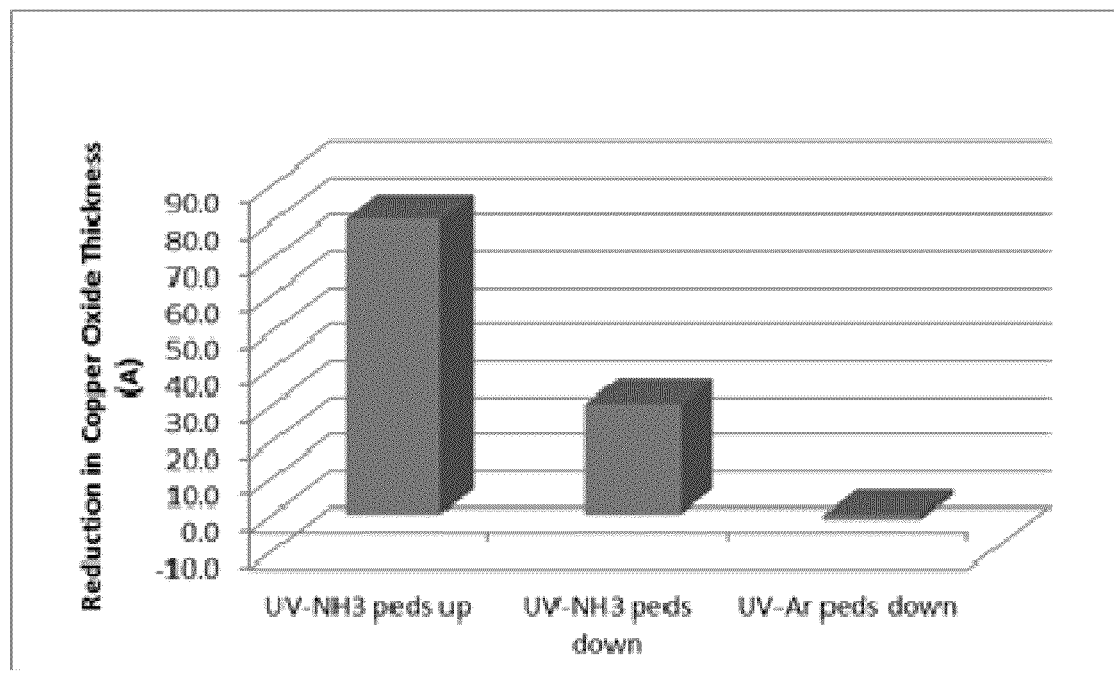
FIG. 9B shows a graph illustrating the effects of exposure to UV radiation and UV intensity with the estimated copper oxide converted to pure copper.

FIG. 9A shows a graph illustrating the effects of exposure to UV radiation and UV intensity with the change in reflectivity of copper. FIG. 9B shows a graph illustrating the effects of exposure to UV radiation and UV intensity with the estimated copper oxide converted to pure copper from FIG. 9A.

The higher the reflectivity of the copper sample, the greater the presence of converted pure copper from copper oxide. Here, the samples observed were blanket copper seeded wafers. Some of the copper seeded wafers were exposed to a reducing gas atmosphere containing $NH_3$, and a control sample was exposed to an inert atmosphere containing Ar. In the reducing gas atmosphere, molecules of $NH_3$ were radicalized by exposure to UV light, with one sample having the copper seeded wafers close to the UV source ("peds up") and another sample having the copper seeded wafers away from the UV source ("peds down"). Exposure to the reducing gas atmosphere lasted for about 30 seconds with the reducing chamber maintained at a temperature of about 100° C. Each of the samples of copper seeded wafers had on average about 20 Å of copper oxide.

In FIG. 9A, exposure to a reducing gas atmosphere containing radicalized $NH_3$ with the UV light close to the copper seeded wafer resulted in the highest reflectivity of the copper sample. Exposure to a reducing gas atmosphere containing radicalized $NH_3$ with the UV light away from the copper seeded wafer resulted in a moderate reflectivity of the copper sample, while exposure to an inert gas atmosphere resulted in a negligible reflectivity of the copper sample. Thus, exposing the copper seeded wafer to radicalized $NH_3$ with a high UV light intensity reduces a higher amount of copper oxide than exposing the copper seeded wafer to radicalized $NH_3$ with a low UV light intensity or exposing the copper seeded wafer to an inert gas atmosphere. This is corroborated by the data in FIG. 9B, which takes the results from FIG. 9A and calculates the estimated amount of copper oxide converted to metallic copper based on surface resistance measurements.

Figure 10:
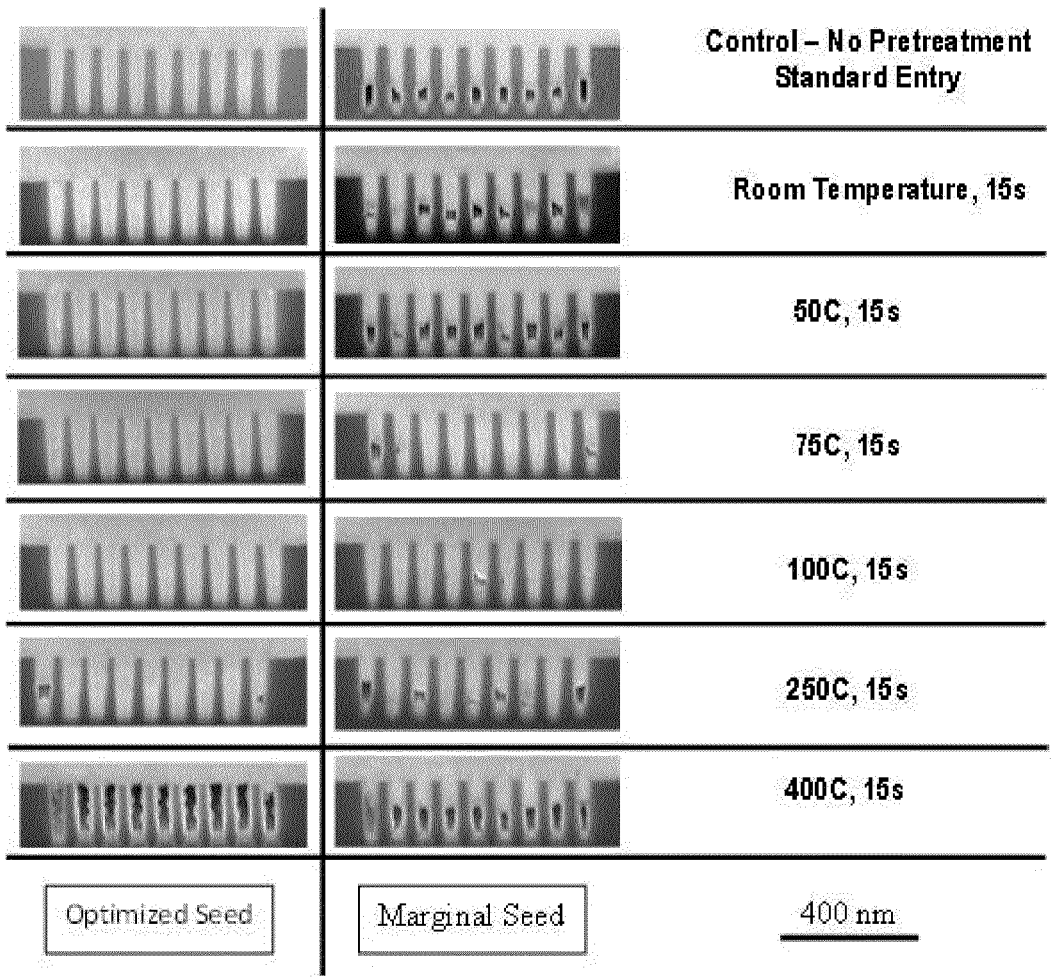
FIG. 10 shows scanning electron microscopy (SEM) images of optimized and marginal seed trench coupons from reducing gas atmosphere treatments at different process temperatures illustrating the presence of voids.

FIG. 10 shows scanning electron microscopy (SEM) images of optimized and marginal seed trench coupons from reducing gas atmosphere treatments at different process temperatures illustrating the presence of voids. Each of the reducing gas atmosphere treatments were carried out at different temperatures, from ambient temperature to about 400° C., and each for a duration of about 15 seconds. The reducing gas atmosphere treatments exposed $NH_3$ to UV light to radicalize $NH_3$, and then exposed the trench coupons to radicalized $NH_3$. Copper is then plated in each of the trench coupons. Representative scanning electron microscopy (SEM) cross section images were taken for each of the conditions, with one of the images providing the control condition without any reducing gas atmosphere treatment.

The first control condition plated copper without any reducing gas atmosphere treatment, which resulted in poor fill almost entirely through each of the trench coupons. The second and third conditions plated copper after reducing gas treatments at ambient temperature and 50° C., respectively, resulting in a relatively poor fill and large bottom void sizes. For the fourth and fifth conditions, on exposures to temperatures of about 75° C. and about 100° C., respectively, the plated copper in the trench coupons exhibited good fill and substantially reduced bottom void sizes. For the sixth and seventh conditions, on exposures to temperatures of about 250° C. and 400° C., respectively, the plated copper in the trench coupons exhibited larger bottom void sizes than the trench coupons in the fourth and fifth conditions. Without being bound by any theory, the increased void sizes may have resulted from the effects of agglomeration at such elevated temperatures.

In copper seeded trench coupons, bottom voids may be decreased with $NH_3$ and UV light exposure and increasing temperature up to about 100° C. prior to copper plating. However, temperatures higher than about 100° C. or more may lead to larger bottom voids in the copper seeded trench coupons. This may be due in part to copper seed agglomeration that does not form a uniform layer that bulk copper can be deposited on.

Figure 11:
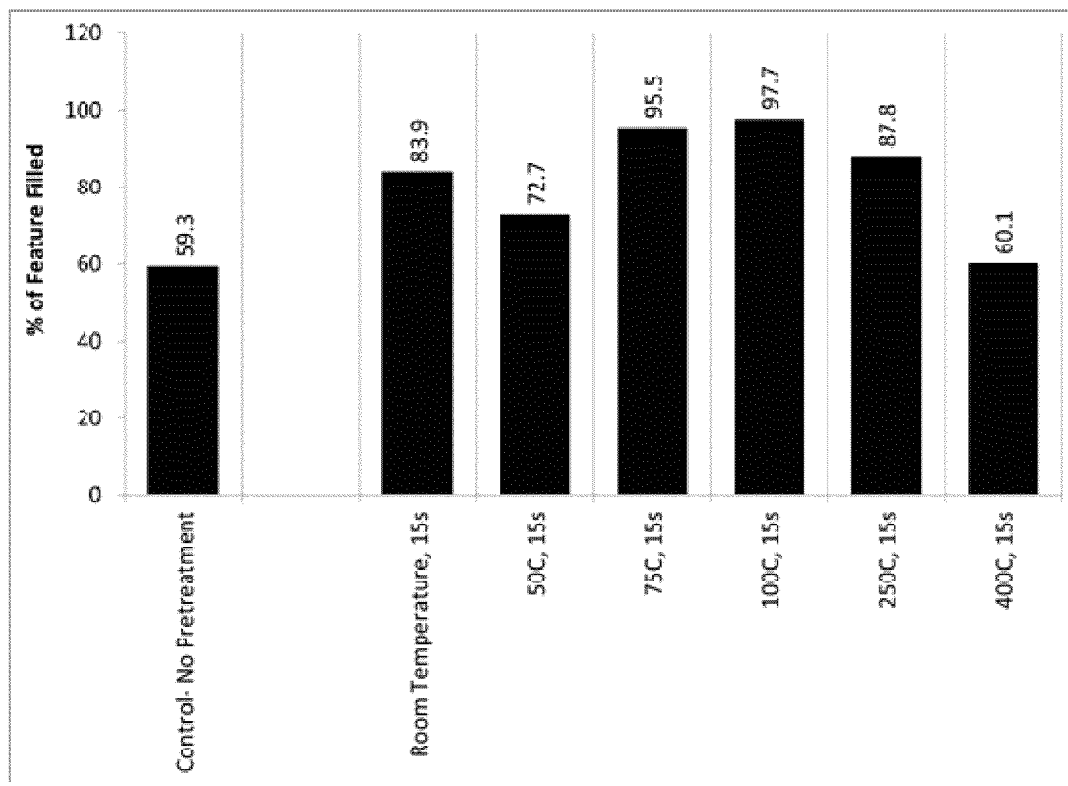
FIG. 11 shows a graph illustrating the percentage of feature fill from each of the reducing gas atmosphere treatments in the optimized and marginal seed trench coupons in FIG. 10.

FIG. 11 shows a graph illustrating the percentage of feature fill from each of the reducing gas atmosphere treatments in the optimized and marginal seed trench coupons in FIG. 10. The graph summarizes the percentage of feature fill taken from the samples in FIG. 10, showing a high percentage of feature fill when $NH_3$ is exposed to UV light in a reducing gas atmosphere at increased temperatures up to about 100° C., and decreased percentage of feature fill at temperatures above 100° C. The calculated percentage of feature fill taken from the samples in FIG. 10 confirms what is seen in the SEM images in FIG. 10.

Other Embodiments

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of preparing a substrate. with a metal seed layer for plating,the method comprising:
   receiving a substrate having the metal seed layer on a plating surface of the substrate, wherein a portion of the metal seed layer has been converted to an oxide of the metal; and
   exposing at least the oxide of the metal to a radicalized reducing gas atmosphere, wherein the reducing gas atmosphere comprises radicals of reducing gas species, and wherein exposure to the reducing gas atmosphere reduces the oxide of the metal to the metal in the form of a film integrated with the seed layer;
   cooling the substrate using an active cooling system during exposure to the radicalized reducing gas atmosphere to maintain a substrate temperature below a temperature that produces agglomeration of the metal seed layer;
   transferring the substrate to a plating bath containing a plating solution; and
   plating metal onto the metal seed layer using the plating solution.

2. The method of claim 1, wherein the metal comprises copper.

3. The method of claim 2, wherein the substrate is maintained at a temperature below about 150° C.

4. The method of claim 2, wherein the substrate temperature is maintained at a temperature below about 100° C. by an actively cooled pedestal.

5. The method of claim 1 wherein the thickness of the metal seed layer is less than about 100 Å.

6. The method of claim 1, wherein the plating surface comprises recesses having height to width aspect ratios of greater than about 5:1.

7. The method of claim 1, wherein the metal seed layer includes a semi-noble metal that serves as a diffusion barrier.

8. The method of claim 1, wherein the substrate comprises a damascene template, wherein the damascene template comprises vias with height to width aspect ratios of greater than about 5:1.

9. The method of claim 1, wherein the reducing gas species comprises at least one of hydrogen, ammonia, carbon monoxide, diborane, sulfite compounds, carbon and/or hydrocarbons, phosphites, and hydrazine.

10. The method of claim 1, further comprising exposing the reducing gas species to ultraviolet radiation to form radicals of the reducing gas species.

11. The method of claim 10, wherein the wavelength of the ultraviolet radiation is between about 100 nm and about 400 nm.

12. The method of claim 11, wherein the wavelength of the ultraviolet radiation is between about 120 nm and about 170 nm, 13. The method of claim 10, wherein the intensity of the ultraviolet radiation is between about 1 W/cm$^2$ and about 10 W/cm$^2$.

14. The method of claim 1, further comprising exposing the reducing gas species to a remote plasma to form radicals of the reducing gas species.

15. The method of claim 14, wherein the remote plasma comprises a radio frequency (RF) power source or microwave power source.

16. The method of claim 1, wherein the exposing step is performed in a chamber having a pressure between about 0.1 Torr and about 50 Torr.

17. The method of claim 1, wherein the exposing step is performed in a chamber having a temperature between about 10° C. and about 500° C.

18. The method of claim 1, wherein the exposing step comprises introducing each of the reducing gas species at a flow rate between about 1 sccm and about 100,000 sccm.

19. The method of claim 1, wherein the exposing step is performed in a chamber for a duration between about 1 second and about 60 minutes.

20. The method of claim 1, wherein the substrate is maintained under an atmosphere substantially free of oxygen while transferring the substrate to the plating bath.

* * * * *